(12) United States Patent
Suzuki et al.

(10) Patent No.: US 10,818,697 B2
(45) Date of Patent: Oct. 27, 2020

(54) SEMICONDUCTOR DEVICE, DISPLAY DEVICE, AND METHOD OF PRODUCING SEMICONDUCTOR DEVICE

(71) Applicant: Sharp Kabushiki Kaisha, Sakai, Osaka (JP)

(72) Inventors: Masahiko Suzuki, Sakai (JP); Tohru Daitoh, Sakai (JP); Hajime Imai, Sakai (JP); Tetsuo Kikuchi, Sakai (JP); Setsuji Nishimiya, Sakai (JP); Teruyuki Ueda, Sakai (JP); Masamitsu Yamanaka, Sakai (JP); Kengo Hara, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/515,057

(22) Filed: Jul. 18, 2019

(65) Prior Publication Data
US 2020/0043955 A1  Feb. 6, 2020

Related U.S. Application Data

(60) Provisional application No. 62/714,802, filed on Aug. 6, 2018.

(51) Int. Cl.
*H01L 27/12* (2006.01)
*G02F 1/1362* (2006.01)
*G02F 1/1368* (2006.01)

(52) U.S. Cl.
CPC ........ *H01L 27/1225* (2013.01); *G02F 1/1368* (2013.01); *G02F 1/136209* (2013.01); *G02F 1/136286* (2013.01); *H01L 27/124* (2013.01); *H01L 27/127* (2013.01); *H01L 27/1251* (2013.01); *G02F 2001/13685* (2013.01); *G02F 2202/104* (2013.01)

(58) Field of Classification Search
CPC ......... G02F 1/136209; G02F 1/136286; G02F 2001/13685; H01L 27/1225; H01L 27/124; H01L 27/1251; H01L 29/78633
USPC ........................................... 257/72
See application file for complete search history.

(56) References Cited

U.S. PATENT DOCUMENTS

2003/0141811 A1\* 7/2003 Park ............... H01L 27/1255
  313/506
2007/0152217 A1\* 7/2007 Lai ................. H01L 29/7869
  257/59
2017/0338249 A1  11/2017 Suzumura et al.
2018/0308869 A1  10/2018 Suzumura et al.

FOREIGN PATENT DOCUMENTS

JP  2017-208473 A  11/2017

\* cited by examiner

*Primary Examiner* — Long K Tran
(74) *Attorney, Agent, or Firm* — Keating & Bennett, LLP

(57) ABSTRACT

A semiconductor device includes a first TFT, a first source-side connection section that is formed from a part of a second metal film and connected to a first source region, a first drain-side connection section that is formed from a part of the second metal film and connected to a first drain region, a second TFT that is driven by the first TFT, a second source-side connection section that is formed from a part of a first metal film and connected to a second source region, and a second drain-side connection section that is formed from a part of the first metal film or a second transparent electrode film and connected to a second drain region.

10 Claims, 20 Drawing Sheets

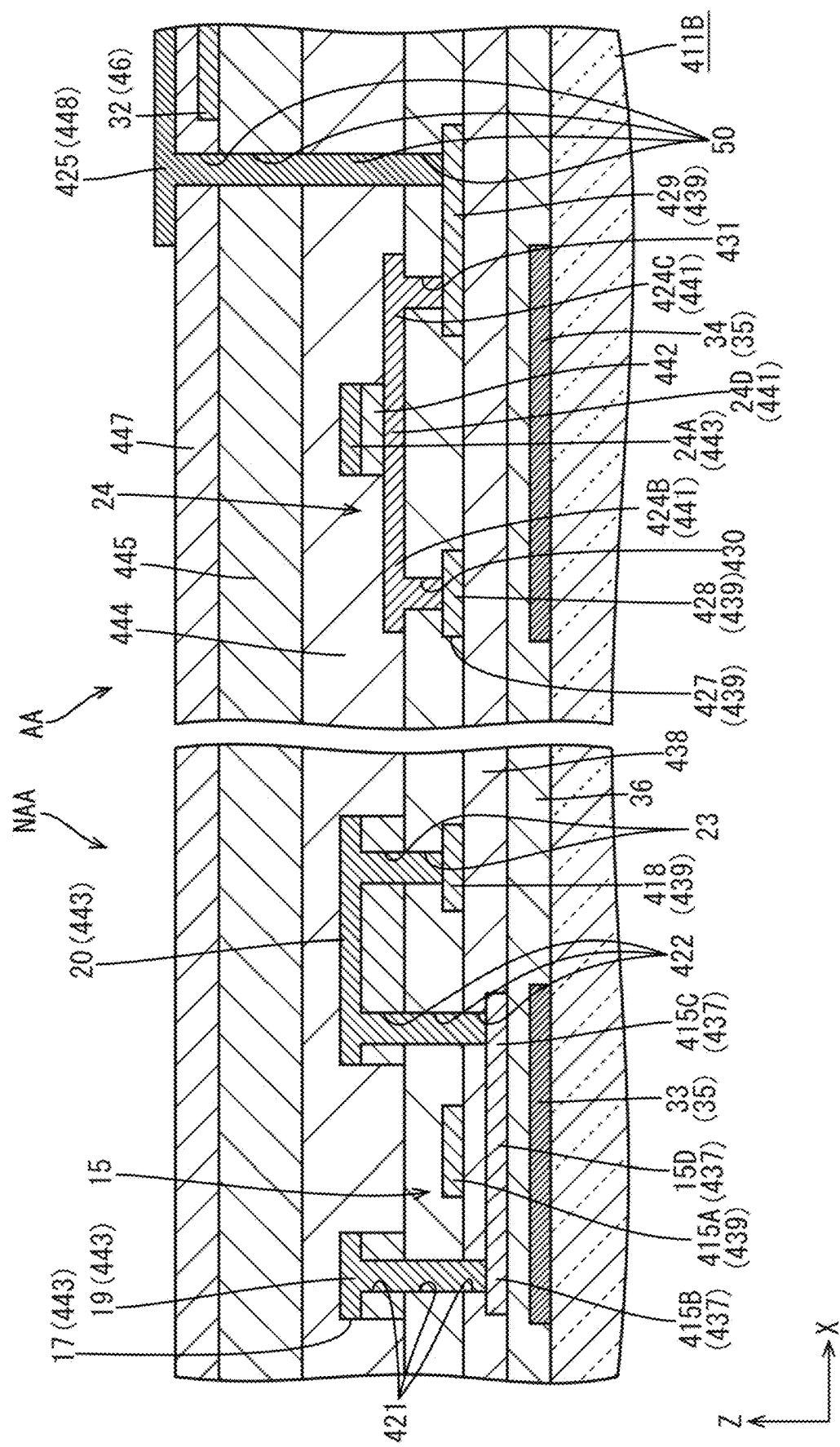

SEMICONDUCTOR DEVICE, DISPLAY DEVICE, AND METHOD OF PRODUCING SEMICONDUCTOR DEVICE

CROSS REFERENCE TO RELATED APPLICATION

This application claims priority from U.S. Provisional Application No. 62/714,802 filed on Aug. 6, 2018. The entire contents of the priority application are incorporated herein by reference.

TECHNICAL FIELD

The present technology described herein relates to a semiconductor device, a display device, and a method of producing a semiconductor device.

BACKGROUND ART

An example of a display device disclosed in Japanese Unexamined Patent Application Publication No. 2017-208473 has been known. The display device includes a substrate having a display region where pixels are formed. The pixel includes a first TFT using an oxide semiconductor. An oxide film serving as an insulator is formed on the oxide semiconductor, and a gate electrode is formed on the oxide film. A first electrode is connected to a drain of the first TFT via a first through hole formed in the oxide film. A second electrode is connected to a source of the first TFT via a second through hole formed in the oxide film. In addition, in the display device, the second TFT used for a surrounding driving circuit uses LTPS. To connect the LTPS to the drain electrode or the source electrode, a through hole is formed in the insulation film covering the LTPS and hydrofluoric acid cleaning is performed to remove an oxide on the surface of the LTPS in the through hole. The oxide film functions as a sacrificial layer for preventing hydrofluoric acid from permeating into the oxide semiconductor in the hydrofluoric acid cleaning.

In the display device, the oxide film that is formed of aluminum oxide is necessarily formed as the sacrificial layer and selective variation of material becomes smaller. Furthermore, the through holes for the first TFT and the second TFT are collectively formed. However, the number of insulation films that are to be subjected to etching for forming the through holes differs for each of the first TFT and the second TFT. Therefore, it is actually difficult to form each through hole with an appropriate depth. Furthermore, the through hole for the second TFT is formed to be through each insulation film, while the through hole for the first TFT is necessarily formed not to be through the sacrificial layer. It is very difficult to perform such etching with high accuracy. Also, the sacrificial layer is necessarily etched twice and this may increase a production cost.

SUMMARY

The present technology described herein was made in view of the above circumstances. An object is to solve problems that are caused in forming each contact hole.

A semiconductor device according to the present technology includes: a first semiconductor film; a first insulation film disposed on an upper layer side of the first semiconductor film; a first metal film disposed on an upper layer side of the first insulation film; a second insulation film disposed on an upper layer side of the first metal film; a second semiconductor film disposed on an upper layer side of the second insulation film; a third insulation film disposed on an upper layer side of the second semiconductor film; a second metal film disposed on an upper layer side of the third insulation film; a fourth insulation film disposed on an upper layer side of the second metal film; a transparent electrode film disposed on an upper layer side with respect to the fourth insulation film; a first TFT including a first gate electrode that is formed from a part of the first metal film, a first channel region that is formed from a part of the first semiconductor film and disposed to overlap the first gate electrode, a first source region that is formed from a part of the first semiconductor film and continuous to the first channel region, and a first drain region that is formed from a part of the first semiconductor film and continuous from a section of the first channel region opposite from a first source region side; a first source-side connection section that is formed from a part of the second metal film and disposed to overlap the first source region and connected to the first source region through first source-side contact holes formed in the first insulation film, the second insulation film, and the third insulation film; a first drain-side connection section that is formed from a part of the second metal film and disposed to overlap the first drain region and connected to the first drain region through first drain-side contact holes formed in the first insulation film, the second insulation film, and the third insulation film; a second TFT that is driven by the first TFT and including a second gate electrode that is formed from a part of the second metal film, a second channel region that is formed from a part of the second semiconductor film and disposed to overlap the second gate electrode, a second source region that is formed from a part of the second semiconductor film and continuous to the second channel region, and a second drain region that is formed from a part of the second semiconductor film and continuous from a section of the second channel region opposite from a second source region side; a second source-side connection section that is formed from a part of the first metal film and disposed to overlap the second source region and connected to the second source region through a second source-side contact hole formed in the second insulation film; and a second drain-side connection section that is formed from a part of the first metal film or the transparent electrode film and disposed to overlap the second drain region and connected to the second drain region through a second drain-side contact hole formed in the second insulation film or at least the fourth insulation film.

A display device according to the present technology includes the above semiconductor device, a display region displaying an image, and a non-display region displaying no image.

A method of producing a semiconductor device according to the present technology includes: a first semiconductor film forming process of forming a first semiconductor film; a first semiconductor film etching process of etching the first semiconductor film to form a first source region, a first channel region, and a first drain region included in a first TFT; a first insulation film forming process of forming a first insulation film on an upper layer side of the first semiconductor film; a first metal film forming process of forming a first metal on an upper layer side of the first insulation film; a first metal film etching process of etching the first metal film to at least form a first gate electrode forming a part of the first TFT and overlapping the first channel region and a second source-side connection section connected to a second TFT that is driven by the first TFT; a second insulation film forming process of forming a second insulation film on an upper layer side of the first metal film; a second insulation film etching process of etching the second insulation film to form at least a second source-side contact hole in a position overlapping the second source-side connection section; a second semiconductor film forming process of forming a second semiconductor film on an upper layer side of the second insulation film; a second semiconductor film etching process of etching the second semiconductor film to form a second source region that forms a part of the second TFT and is connected to the second source-side connection section through the second source-side contact hole and form a second channel region and a second drain region of the second TFT that form a part of the second TFT; a third insulation film forming process of forming a third insulation film on an upper layer side of the second semiconductor film; a third insulation film etching process of etching the third insulation film together with the first insulation film and the second insulation film to form first source-side contact holes and first drain-side contact holes so as to overlap the first source region and the first drain region, respectively; a second metal film forming process of forming a second metal film on an upper layer side of the third insulation film; a second metal film etching process of etching the second metal film together with the third insulation film to at least form a second gate electrode that forms a part of the second TFT and overlaps the second channel region, a first source-side connection section that is connected to the first source region through the first source-side contact holes, and a first drain-side connection section that is connected to the first drain region through a second drain-side contact hole; a fourth insulation film forming process of forming a fourth insulation film on an upper layer side of the second metal film; a fourth insulation film etching process of etching the fourth insulation film; a transparent electrode film forming process of forming a transparent electrode film on an upper layer side with respect to the fourth insulation film; and a transparent electrode film etching process of etching the transparent electrode film, and in the second insulation film etching process or in the fourth insulation film etching process, the second drain-side contact hole is formed in the second insulation film or at least the fourth insulation film to overlap the second drain region, and in the first metal film etching process or in the transparent electrode film etching process, a second drain-side connection section that is connected to the second drain region through the second drain-side contact hole is formed.

According to the present technology described herein, problems that are caused in forming each contact hole are solved.

BRIEF DESCRIPTION OF THE DRAWINGS

FIG. 20 is a cross-sectional view illustrating a first TFT and a second TFT included in an array substrate according to a fifth embodiment of the present technology.

DETAILED DESCRIPTION

First Embodiment

Figure 1:
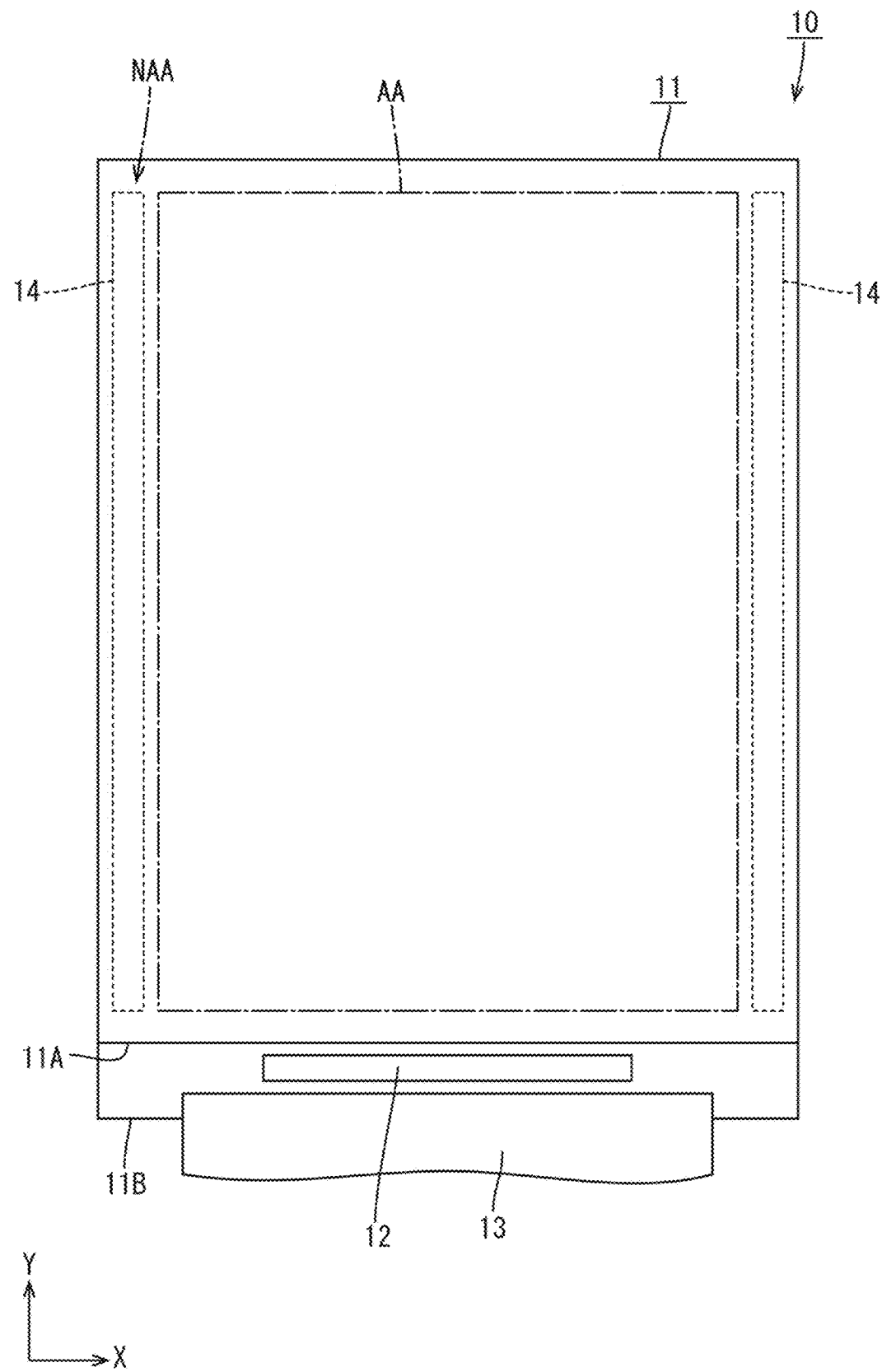
FIG. 1 is a plan view illustrating a liquid crystal panel, a driver, and a flexible circuit board included in a liquid crystal display device according to a first embodiment of the present technology.

A first embodiment of the present technology will be described with reference to FIGS. 1 to 16. In the embodiment section, a liquid crystal panel (a display panel) 11 included in a liquid crystal display device 10 will be described as an example. X-axis, Y-axis and Z-axis may be present in the drawings and each of the axial directions represents a direction represented in each drawing. An upper side and a lower side in FIGS. 3, 5 and 6-16 correspond to a front side and a back side, respectively.

FIG. 1 is a general plan view illustrating a connection structure of the liquid crystal panel 11 and a flexible circuit board 13 included in the liquid crystal display device 10. As illustrated in FIG. 1, the liquid crystal display device 10 at least includes the liquid crystal panel 11 displaying images, a driver (a panel driving section, drive circuit section) 12 that drives the liquid crystal panel 11, a flexible circuit board 13 one end of which is connected to the liquid crystal panel 11, and a backlight device that is disposed on a rear side with respect to the liquid crystal panel 11 and is an external light source supplying light to the liquid crystal panel for displaying. The driver 12 and the flexible circuit board 13 are mounted on the liquid crystal panel 11 with an anisotropic conductive film (ACF). A control circuit board that is a signal supply source supplying various kinds of input signals from external devices is connected to another end of the flexible circuit board 13 opposite from the liquid crystal panel 11 side.

As illustrated in FIG. 1, the liquid crystal panel 11 has a vertically-elongated quadrangular overall shape. The liquid crystal panel 11 has a display region (an active area) AA in a middle section of a plate surface thereof and a non-display region (a non-active area) NAA surrounding the display region AA and on an outer peripheral side of the plate surface of the liquid crystal panel 11. The display region AA displays images. The non-display area NAA has a frame-like plan view shape (or a picture frame-like shape) and does not display an image. A short-side dimension and a long-side dimension of the liquid crystal panel 11 correspond to the X-axis direction and the Y-axis direction, respectively. A thickness dimension of the liquid crystal panel 11 corresponds to the Z-axis direction. An outline of the display region AA is described with a dashed line in FIG. 1 and an area outside the dashed line is the non-display region NAA. The liquid crystal panel 11 at least includes a pair of glass substrates 11A, 11B. One on the front (a front-surface side) is a CF substrate (a counter substrate) 11A and the other one on the rear (a rear-surface side) is an array substrate (a semiconductor device, a thin film transistor substrate) 11B. Polarizing plates are bonded on outer surfaces of the respective boards 11A and 11B.

Figure 11:
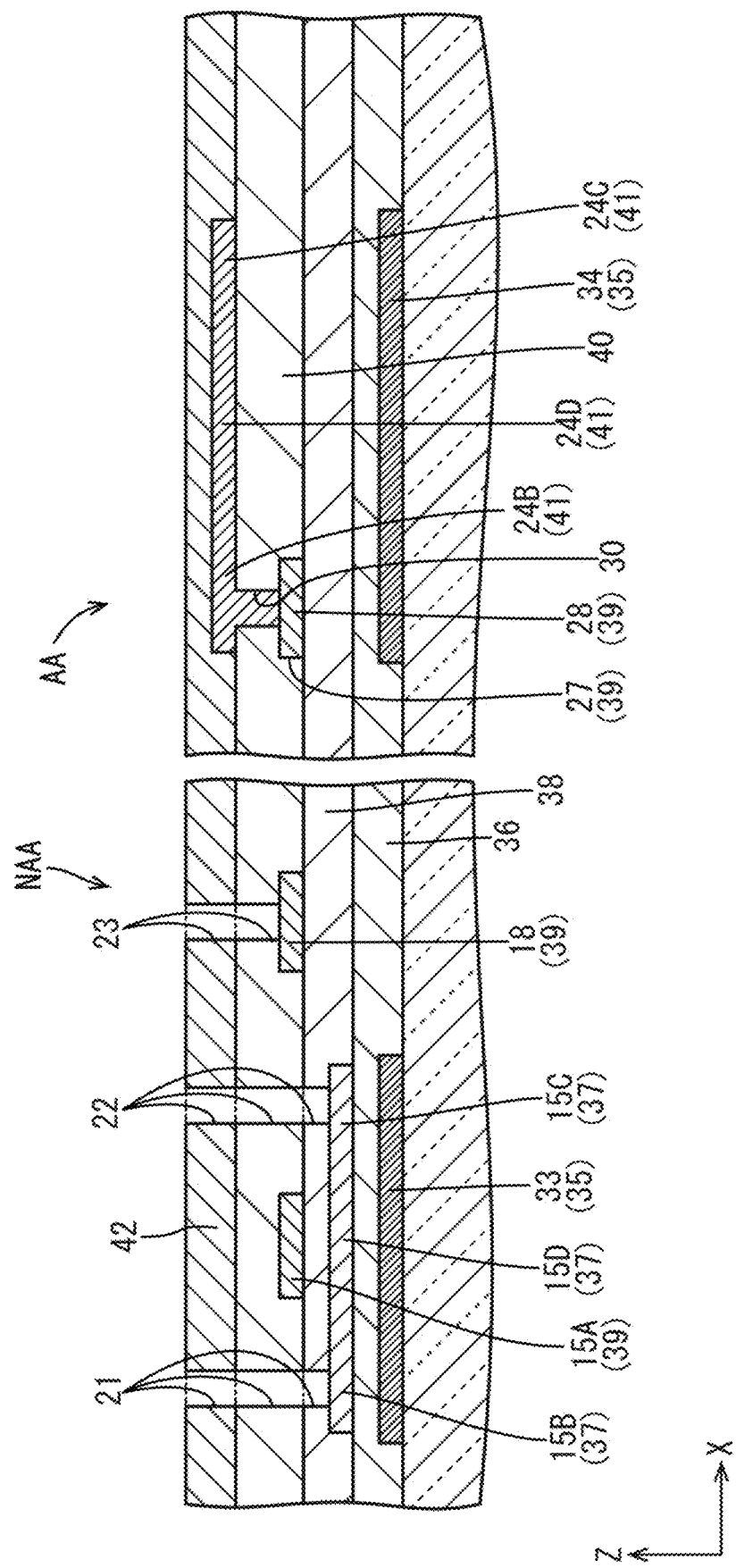
FIG. 11 is a cross-sectional view of the array substrate that has been subjected to a third insulation film forming process and a third insulation film etching process in the method of producing an array substrate.

As illustrated in FIG. 11, a gate circuit 14 is disposed in the non-display region NAA of the array substrate 11B included in the liquid crystal panel 11. The gate circuit 14 has a belt-like shape extending in the Y-axis direction and a pair of gate circuits 14 are arranged to sandwich the display region AA therebetween with respect to the X-axis direction. The gate circuit 14 is configured to supply scan signals to lines (specifically, second gate lines 26 which will be described later) in the display region AA. The gate circuits 14 are disposed on the array substrate 11B as a monolithic circuit and include a circuit that outputs the scan signals at a certain timing or a buffer circuit for amplifying the scan signals.

Figure 2:
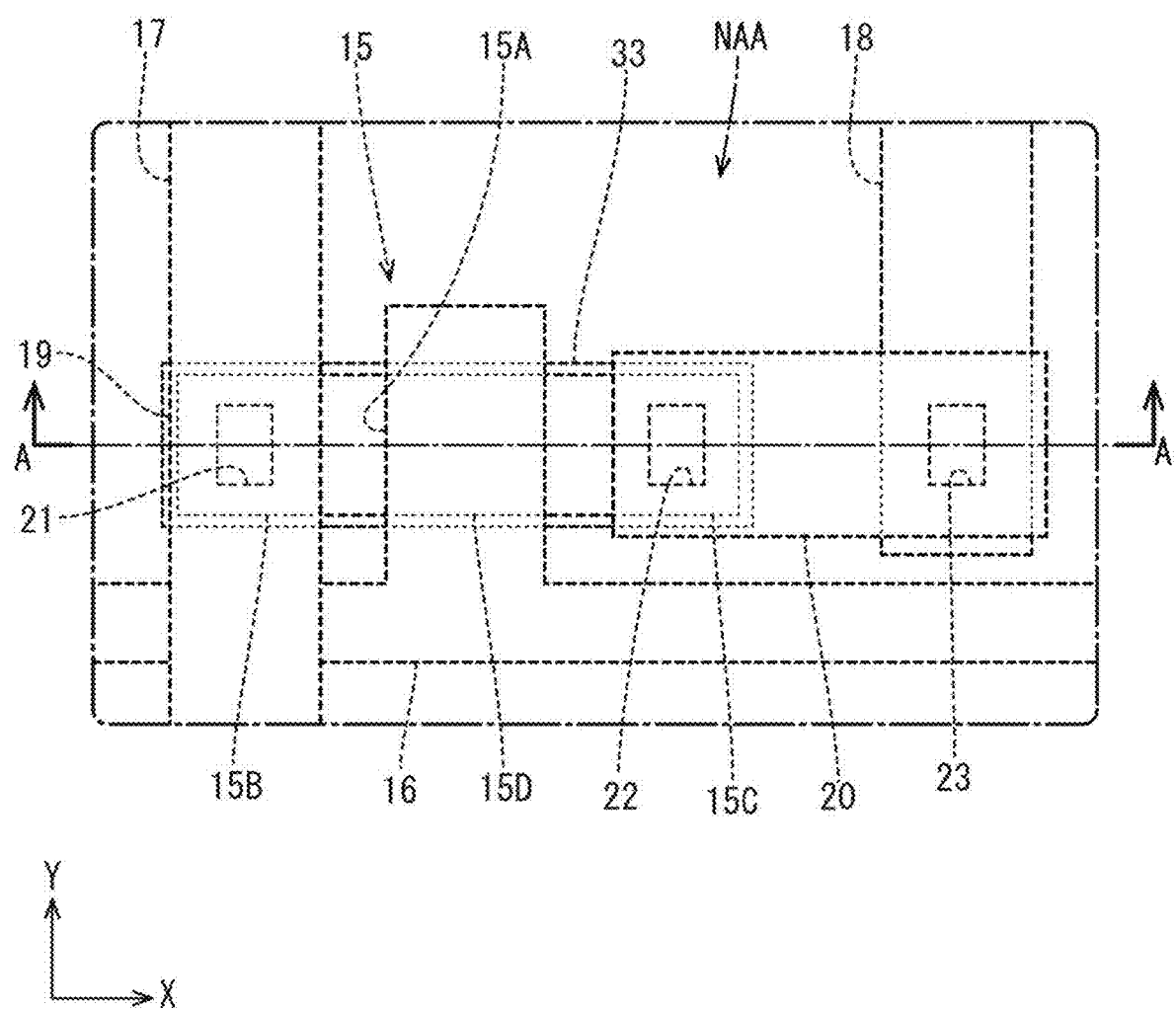
FIG. 2 is a plan view illustrating a section near a first TFT included in a gate circuit in a non-display region of an array substrate included in the liquid crystal panel.

As illustrated in FIG. 2, the gate circuit 14 that is disposed in the non-display region NAA of the array substrate 11B at least includes a first TFT (driving TFT) 15 that is included in various kinds of circuits. The gate circuit 14 includes a first gate line 16 through which signals for driving the first TFT 15 are transmit, a first source line 17 through which signals are supplied to the first TFT 15, and a second drain-side line (first drain opposite-side connection section) 18 through which signals supplied to the first source line 17 are supplied through the first TFT 15. The first TFT 15 includes a first gate electrode 15A that is continuous from the first gate line 16, a first source region 15B that is connected to the first source line 17, a first drain region 15C that is connected to the first drain line 18, and a first channel region 15D that is continuous from the first source region 15B and the first drain region 15C. The first gate electrode 15A and the first channel region 15D overlap each other in a plan view.

Figure 3:
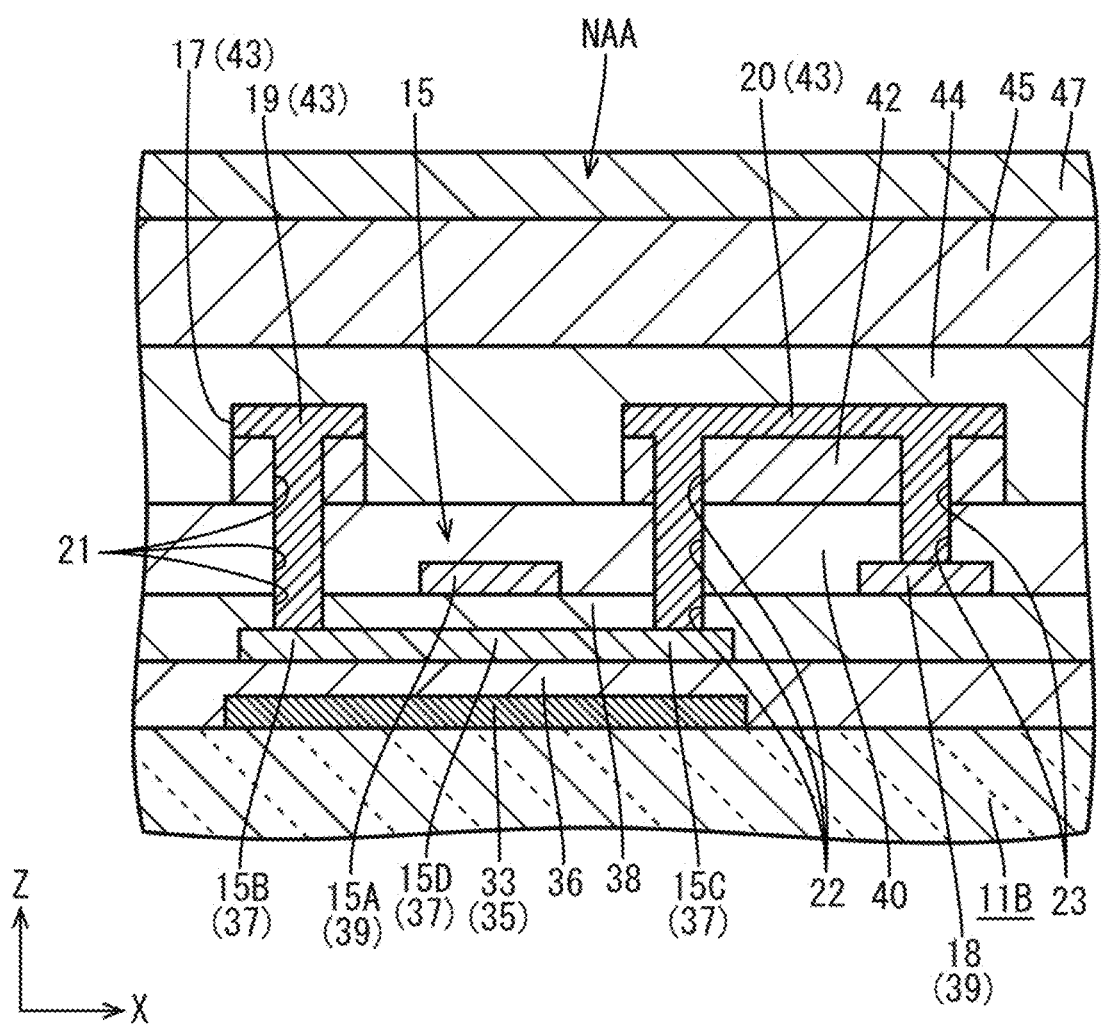
FIG. 3 is a cross-sectional view of the array substrate taken along A-A line in FIG. 2.

As illustrated in FIG. 3, a section of the first source line 17 overlapping the first source region 15B includes a first source-side connection section 19 that is directly connected to the first source region 15B. On the other hand, the gate circuit 14 includes a first drain-side connection section 20 that is directly connected to the first drain region 15C. The first drain line 18 is connected to the first drain region 15C through the first drain-side connection section 20. Insulation films 38, 40, 42 that are between the first source-side connection section 19 and the first source region 15B have first source-side contact holes 21 for connecting the first source-side connection section 19 and the first source region 15B. The insulation films 38, 40, 42 that are between the first drain-side connection section 20 and the first drain region 15C have first drain-side contact holes 22 for connecting the first drain-side connection section 20 and the first drain region 15C. Insulation films 40, 42 that are between a section of the first drain-side connection section 20 opposite from the first drain region 15C side and the first drain line 18 have first drain opposite-side contact holes 23 for connecting the section and the first drain line 18. The gate circuit 14 includes a first light blocking section (a light blocking section) 33 that is disposed on a back side (a backlight device side) with respect to the first TFT 15. The first light blocking section 33 extends over a region overlapping the first source region 15B, the first drain region 15C and the first channel region 15D of the first TFT 15. The first light blocking section 33 blocks light from the backlight device from being supplied to the first source region 15B, the first drain region 15C, and the first channel region 15D such that each of the regions 15B-15D is less likely to be deteriorated (deterioration by light). Accordingly, change in characteristics of the first TFT 15 is less likely to be caused.

Figure 4:
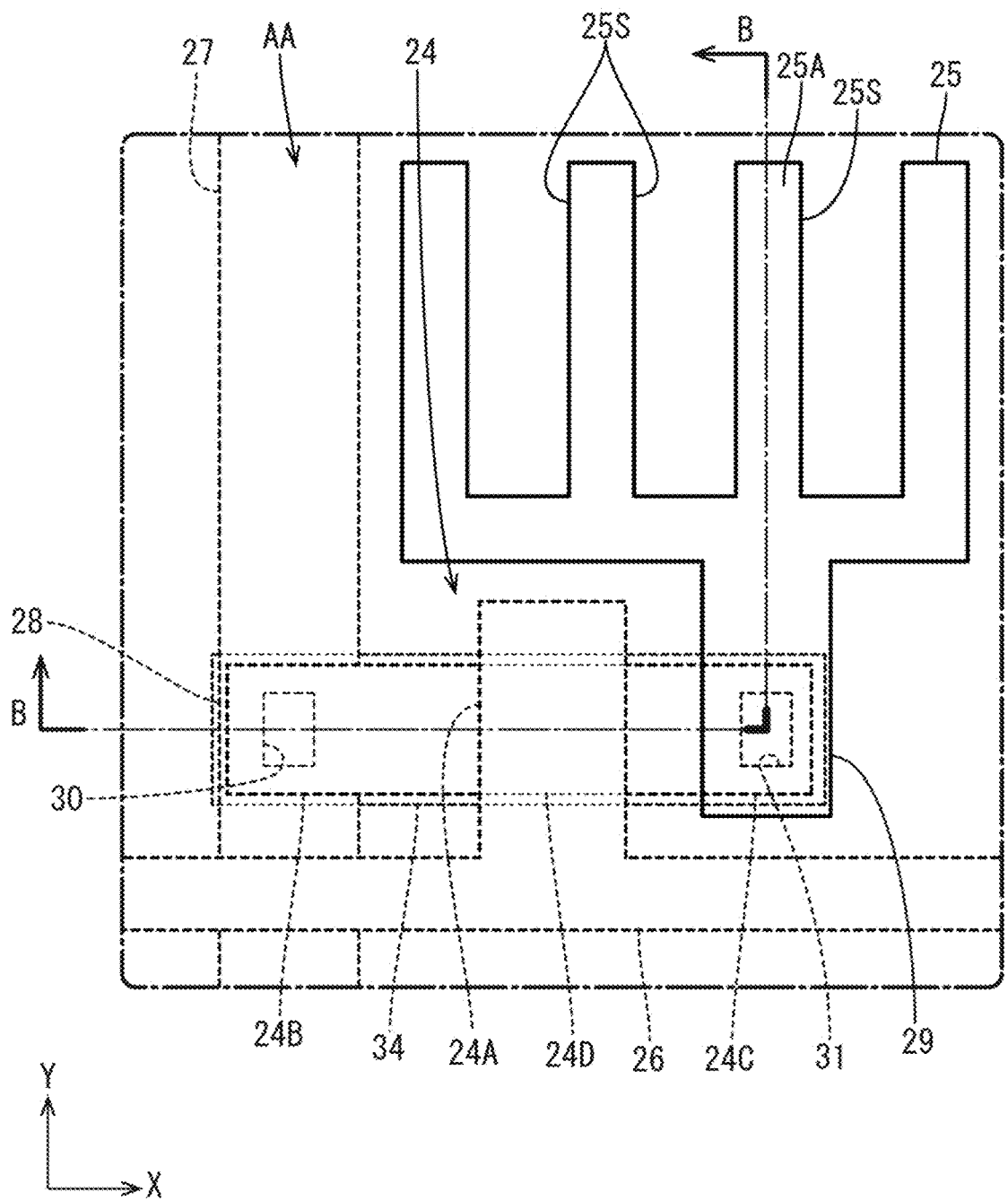
FIG. 4 is a plan view of a section near a second TFT in a display region of the liquid crystal panel.

As illustrated in FIG. 4, a second TFT (a driven TFT) 24 and a pixel electrode 25 connected to the second TFT 24 are at least disposed in the display region AA of the array substrate 11B. The second TFT 24 is driven based on the scan signals supplied from the gate circuit 14 (the first TFT 15). The second TFTs 24 and the pixel electrodes 25 are arranged in a matrix (rows and columns) in the display region. The second gate lines (scan lines) 26 and second source lines (data lines, signal lines) that are arranged in a grid are arranged to surround the second TFTs 24 and the pixel electrodes 25, respectively. The pixel electrode 25 at least includes a body section 25A that is put in a square region surrounded by the second gate lines 26 and the second source lines 27. The body section 25A has slits 25S. The pixel electrode 25 includes a second drain-side connection section 29 projecting from the body section 25A toward the second TFT 24. The second TFT 24 includes a second gate electrode 24A that is continuous to the second gate line 26, a second source region 24B that is connected to the second source line 27, a second drain region 24C that is connected to the pixel electrode 25, and a second channel region 24D that is continuous to the second source region 24B and the second drain region 24C. Out of the above, the second gate electrode 24A and the second channel region 24D overlap each other in a plan view. If the second TFT 24 is driven by the scan signal supplied from the gate circuit 14 through the second gate line 26, the image signal transmitted through the second source line 27 is supplied to the pixel electrode 25 through the second source region 24B, the second channel region 24D and the second drain region 24C. Accordingly, the pixel electrode 25 is charged with a potential based on the image signal transmitted through the second source line 27.

Figure 5:
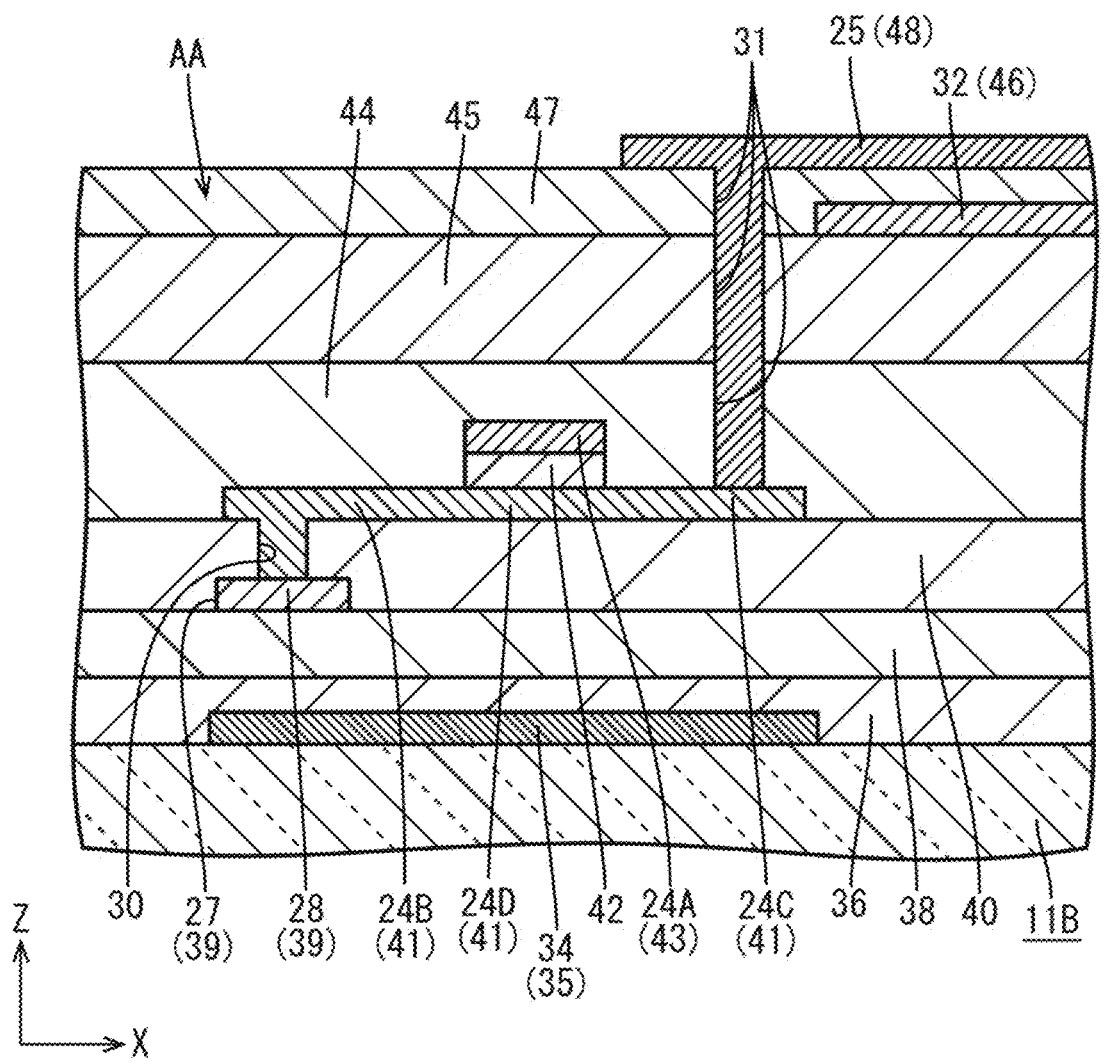
FIG. 5 is a cross-sectional view of the array substrate taken along B-B line in FIG. 4.

As illustrated in FIG. 5, the second source line 27 includes second source-side connection section 28 at a section thereof overlapping the second source region 24B. The second source-side connection section 28 is directly connected to the second source region 24B. On the other hand, the second drain-side connection section 29 of the pixel electrode 25 is disposed to overlap the second drain region 24C and is directly connected to the second drain region 24C. The second insulation film 40 that is between the second source-side connection section 28 and the second source region 24B has a second source-side contact hole 30 for connecting the second source-side connection section 28 and the second source region 24B. Insulation films 44, 45, 47 that are between the second drain-side connection section 29 and the second drain region 24C have second drain-side contact holes 31 for connecting the second drain-side connection section 29 and the second drain region 24C. A second light blocking section (a light blocking section) 34 is disposed on a back side (a backlight device side) with respect to the second TFT 24. The second light blocking section 34 extends over a region overlapping the second source region 24B, the second drain region 24C, and the second channel region 24D of the second TFT 24. The second light blocking section 34 blocks light from the backlight device from being supplied to the second source region 24B, the second drain region 24C and the second channel region 24D such that each of the regions 24B-24D is less likely to be deteriorated (deterioration by light). Accordingly, change in characteristics of the second TFT 24 is less likely to be caused. A common electrode 32 is disposed in the display region AA of the array substrate 11B in a solid manner while overlapping the pixel electrodes 25. If potential difference is created between the pixel electrode 25 and the common electrode 32 that overlap each other, a fringe field (an oblique field) including a component in a direction normal to a plate surface of the array substrate 11B is applied to the liquid crystal layer in addition to a component in a direction along the plate surface of the array substrate 11B. Namely, in this embodiment, a driving type of the liquid crystal panel 11 including the array substrate 11B is a fringe filed switching (FFS) type. Color filters are arranged in the display region AA of the CF substrate 11A in a matrix so as to be opposite the respective pixel electrodes 25 on the array substrate 11B side. The color filters include red (R), green (G), and blue (B) color portions that are arranged in a predetermined sequence repeatedly to form pixels with the pixel electrodes 25. A light blocking film (a black matrix) is formed between the color filters for reducing color mixture.

Next, various kinds of films stacked on an inner surface side of the array substrate 11B will be described in detail with reference to FIGS. 3 and 5. As illustrated in FIGS. 3 and 5, on the array substrate 11B, the films are stacked in the following sequence from the lowest layer (a glass substrate side, a side farthest from the liquid crystal layer): a lower layer-side insulation film (a basecoat film) 36, a first semiconductor film 37, a first insulation film 38, a first metal film 39, a second insulation film 40, a second semiconductor film 41, a third insulation film 42, a second metal film 43, a fourth insulation film 44, a fifth insulation film 45, a first transparent electrode film 46, a sixth insulation film 47, a second transparent electrode film (a transparent electrode film) 48, and an alignment film.

Each of the lower layer-side metal film 35, the first metal film 39, and the second metal film 43 is a single layer film made of one kind of metal material or a multilayer film made of different kinds of metal materials or an alloy to have conductivity and a light blocking property. As illustrated in FIGS. 3 and 5, the lower layer-side metal film 35 forms the first light blocking section 33 and the second light blocking section 34. The first metal film 39 forms the first gate electrode 15A, the first gate line 16, the first drain line 18, the second source line 27, and the second source-side connection section 28. The second metal film 43 forms the first source line 17, the first source-side connection section 19, the first drain-side connection section 20, the second gate electrode 24A, and the second gate line 26.

The first semiconductor film 37 is made of a continuous grain (CG) silicon thin film that is a kind of a polycrystallized silicon film (a polycrystalline silicone film). The CG silicon film is formed as follows. Metal material is added to an amorphous silicon thin film and the additive is subjected to a heating process at a low temperature of 550° C. or lower for a short time. Accordingly, atomic arrangement at a crystal grain boundary of the silicon crystals has continuity. As illustrated in FIG. 3, the first semiconductor film 37 forms the first source region 15B, the first drain region 15C, and the first channel region 15D of the first TFT 15. The first semiconductor film 37 has high electron mobility compared to a second semiconductor film 41, which will be described later. The first semiconductor film 37 is used for the first TFT 15 included in the gate circuit 14 such that the second TFT 24 can be driven appropriately.

The second semiconductor film 41 is an oxide semiconductor film using an oxide semiconductor as material. Specific material of the second semiconductor film 41 is an In—Ga—Zn—O semiconductor (for example, indium gallium zinc oxide) The In—Ga—Zn—O semiconductor is ternary oxide of indium (In), gallium (Ga), and zinc (Zn). A ratio (composition ratio) of indium (In), gallium (Ga), and zinc (Zn) is not limited and may be In:Ga:Zn=2:2:1, In:Ga:Zn=1:1:1, or In:Ga:Zn=1:1:2, for example. The oxide semiconductor (the In—Ga—Zn—O semiconductor) may be amorphous or may be preferably crystalline. The crystalline oxide semiconductor may be preferably a crystalline In—Ga—Zn—O semiconductor having c-axis oriented vertical to a layer surface. As illustrated in FIG. 5, the second semiconductor film 41 forms the second source region 24B, the second drain region 24C, and the second channel region 24D of the second TFT 24. The second semiconductor film 41 has lower electron mobility compared to that of the first semiconductor film 37 while being easily formed with a highly uniform film property over a large area. Therefore, the second TFTs 24 that are formed from the second semiconductor film 41 can be aligned in the display region AA that is larger than the non-display region NAA. Furthermore, the second semiconductor film 41 that is formed of the oxide semiconductor film can be easily provided with a low resistance area in a desired region and the second source region 24B and the second drain region 24C are low resistance areas in this embodiment. The second channel region 24D is a resistance non-lowered area where a resistance is not lowered. Accordingly, the electrons move smoothly between the second source region 24B and the second drain region 24C. Therefore, the connection resistance between the second source region 24B and the second source-side connection section 28 and the connection resistance between the second drain region 24C and the second drain-side connection section 29 can be lowered.

The lower layer-side insulation film 36, the first insulation film 38, the second insulation film 40, the third insulation film 42, the fourth insulation film 44 and the sixth insulation film 47 are made of inorganic insulation material (inorganic resin material). Among them, the fourth insulation film 44 is made of silicon nitride (SiN$_x$) and includes hydrogen therein. The first insulation film 38 is between the first gate electrode 15A and the first channel region 15D of the first TFT 15 and keeps a constant clearance therebetween. Similarly, the third insulation film 42 is between the second gate electrode 24A and the second channel region 24D of the second TFT 24 and keeps a constant clearance therebetween. On the contrary, the fifth insulation film 45 is made of organic insulation material (organic resin material) and has a thickness greater than that of other insulation films 36, 38, 40, 42, 44, 47 and functions as a planarizing film. The first transparent electrode film 46 and the second transparent electrode film 48 are made of transparent electrode material such as indium tin oxide (ITO) or indium zinc oxide (IZO). The first transparent electrode film 46 forms the common electrode 32 and the second transparent electrode film 48 forms the pixel electrode 25. The alignment film is configured to perform initial alignment of liquid crystal molecules included in the liquid crystal layer. As described before, the first TFT 15 of the present embodiment is a so-called top gate type TFT in which the first gate electrode 15A made from the first metal film 39 is included in an upper layer side of and overlapped with the first channel region 15D formed from the first semiconductor film 37 while having the first insulation film 38 therebetween. Similarly, the second TFT 24 is also a so-called top gate type TFT in which the second gate electrode 24A formed from the second metal film 43 is included in an upper layer side of and overlapped with the second channel region 24D formed from the second semiconductor film 41 while having the third insulation film 42 therebetween.

The array substrate 11B of the present embodiment has the above-described configuration and a method of producing the same will be described next. The method of producing the array substrate 11B according to the present embodiment at least includes a lower layer-side metal film forming process of forming the lower layer-side metal film 35, a lower layer-side metal film etching process of etching the lower layer-side metal film 35, a lower layer-side insulation film forming process of forming the lower layer-side insulation film 36, a first semiconductor film forming process of forming the first semiconductor film 37, a first semiconductor film etching process of etching the first semiconductor film 37, a first insulation film forming process of forming the first insulation film 38, a first metal film forming process of forming the first metal film 39, a first metal film etching process of etching the first metal film 39, a second insulation film forming process of forming the second insulation film 40, a second insulation film etching process of etching the second insulation film 40, a second semiconductor film forming process of forming the second semiconductor film 41, a second semiconductor film etching process of etching the second semiconductor film 41, a third insulation film forming process of forming the third insulation film 42, a third insulation film etching process of etching the third insulation film 42, a second metal film forming process of forming the second metal film 43, a second metal film etching process of etching the second metal film 43, a fourth insulation film forming process of forming the fourth insulation film 44, a fifth insulation film forming process of forming the fifth insulation film 45, a first transparent electrode film forming process of forming the first transparent electrode film 46, a first transparent electrode film etching process of etching the first transparent electrode film 46, a sixth insulation film forming process of forming the sixth insulation film 47, a sixth insulation film etching process (including the fourth insulation etching process) of etching the sixth insulation film 47, a second transparent electrode film forming process of forming the second transparent electrode film 48, and a second transparent electrode film etching process of etching the second transparent electrode film 48. Hereinafter, each of the processes will be described in detail with reference to FIGS. 6 to 16. For the convenience of description, both of the first TFT 15 disposed in the non-display region NAA and the second TFT 24 disposed in the display region AA are illustrated in FIGS. 6 to 16.

Figure 6:
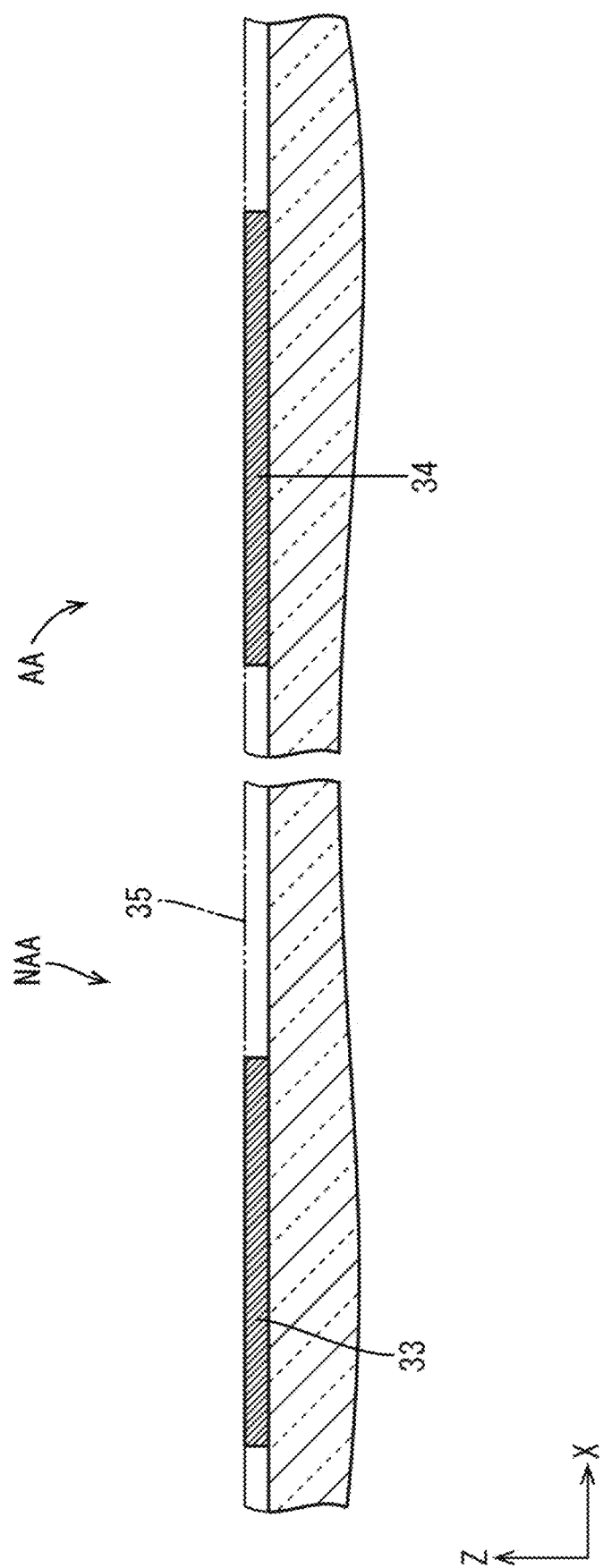
FIG. 6 is a cross-sectional view of the array substrate that has been subjected to a lower layer side metal film forming process and a lower layer side metal film etching process in a method of producing an array substrate.
Figure 7:
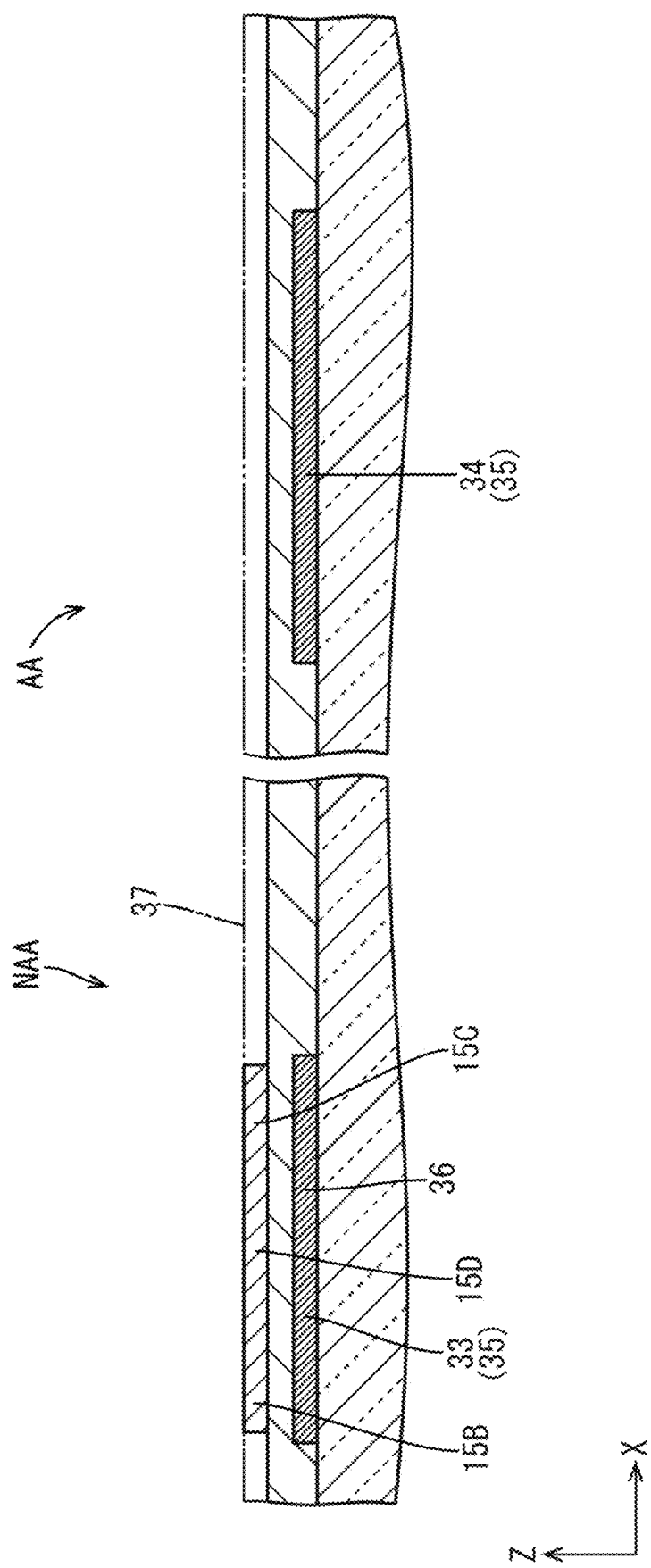
FIG. 7 is a cross-sectional view of the array substrate that has been subjected to a lower layer side insulation film forming process, a first semiconductor film forming process and a first semiconductor film etching process in the method of producing an array substrate.

In the lower layer-side metal film etching process, a photoresist is disposed on the lower layer-side metal film 35 that is formed in the lower layer-side metal film forming process and the photoresist is subjected to exposure and developed. The lower layer-side metal film 35 is subjected to dry etching or wet etching with using the photoresist having the pattern. Then, a section of the lower layer-side metal film 35 that does not overlap the photoresist is removed with etching and a section thereof overlapping the photoresist remains. Accordingly, as illustrated in FIG. 6, a first light blocking section 33 and a second light blocking section 34 that are formed from the lower layer-side metal film 35 are formed. After the etching, the photoresist is separated and removed.

Figure 8:
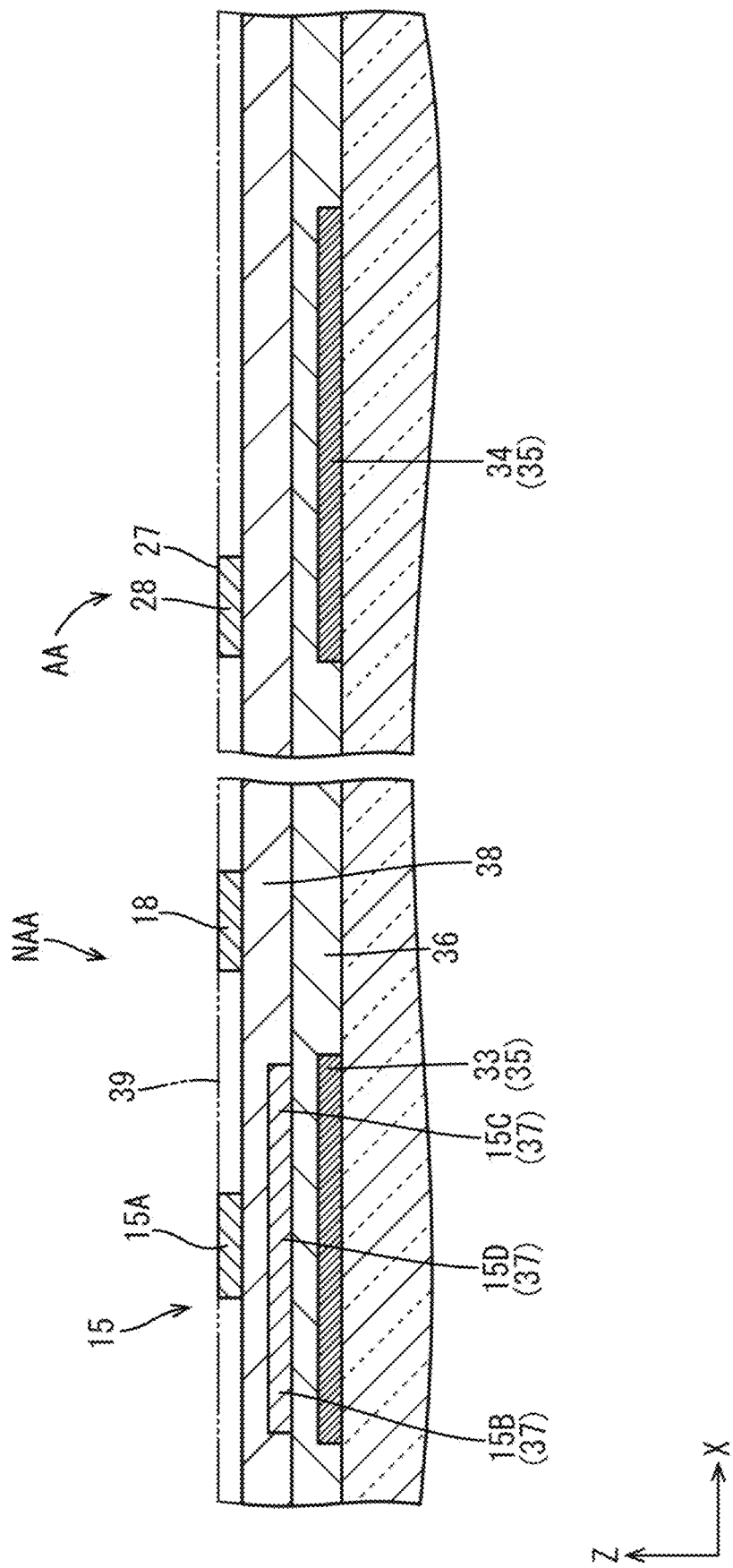
FIG. 8 is a cross-sectional view of the array substrate that has been subjected to a first insulation film forming process, a first metal film forming process and a first metal film etching process in the method of producing an array substrate.

After the lower layer-side insulation film forming process and the first semiconductor film forming process are performed subsequently, the lower layer-side insulation film 36 and the first semiconductor film 37 are formed successively while being stacked on each other. Thereafter, in the first semiconductor film etching process, similar to the lower layer-side metal film etching process, the first semiconductor film 37 is subjected to etching and patterned with using the photoresist that is disposed on the first semiconductor film 37 and subjected to patterning. Accordingly, the first source region 15B, the first drain region 15C, and the first channel region 15D that are formed from the first semiconductor film 37 are formed. Then, after the first insulation film forming process and the first metal film forming process are subsequently performed, the first insulation film 38 and the first metal film 39 are successively formed and stacked on each other. Thereafter, in the first metal film etching process, as illustrated in FIG. 8, similar to the lower layer-side metal film etching process, the first metal film 39 is subjected to etching and patterned with using the photoresist that is disposed on the first metal film 39 and subjected to patterning. Accordingly, the first gate electrode 15A, the first gate line 16, and the first drain line 18, the second source line 27, and the second source-side connection section 28 that are formed from the first metal film 39 are formed.

Figure 9:
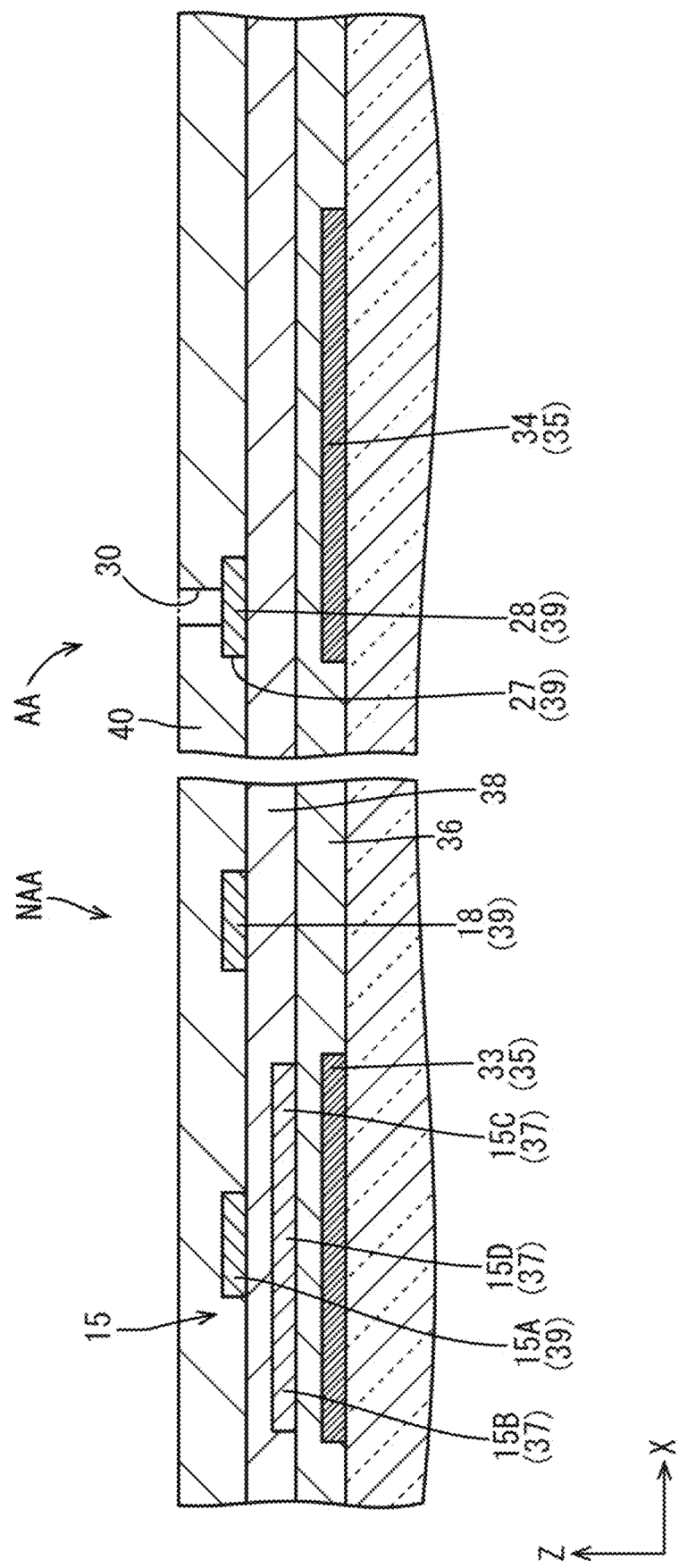
FIG. 9 is a cross-sectional view of the array substrate that has been subjected to a second insulation film forming process and a second insulation film etching process in the method of producing an array substrate.
Figure 10:
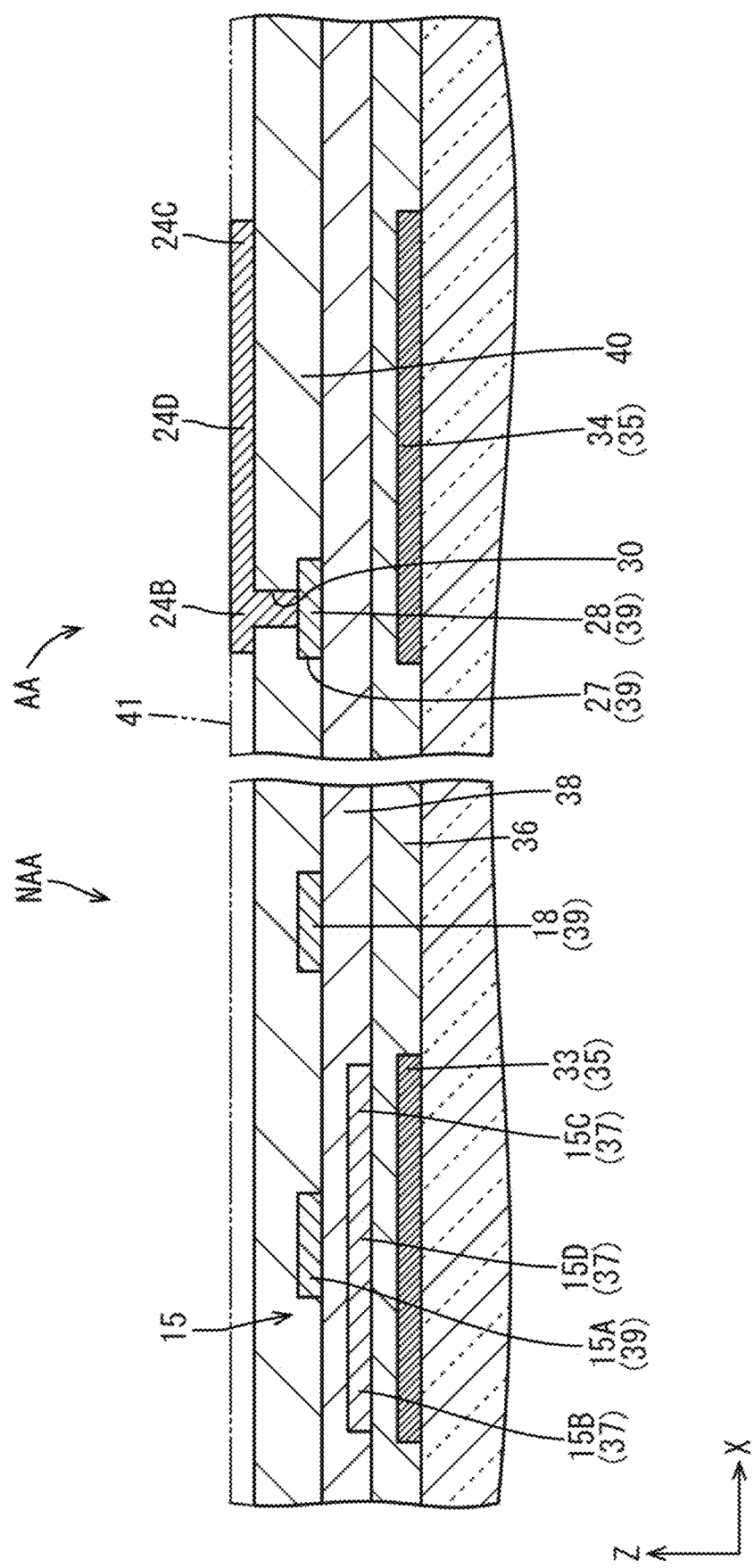
FIG. 10 is a cross-sectional view of the array substrate that has been subjected to a second semiconductor film forming process and a second semiconductor film etching process in the method of producing an array substrate.

In the second insulation film etching process, as illustrated in FIG. 9, similar to the lower layer-side metal film etching process, the second insulation film 40 is subjected to etching and patterned with using the photoresist disposed on the second insulation film 40, which is formed through the second insulation film forming process, and subjected to patterning. The second source-side contact hole 30 is formed in a section of the second insulation film 40 overlapping the second source-side connection section 28. In the second semiconductor film etching process, as illustrated in FIG. 10, similar to the lower layer-side metal film etching process, the second semiconductor film 41 is subjected to etching and patterned with using the photoresist disposed on the second semiconductor film 41, which is formed through the second semiconductor film forming process, and subjected to patterning. Accordingly, the second source region 24B, the second drain region 24C, and the second channel region 24D that are formed from the second semiconductor film 41 are formed. The second source region 24B is connected to the second source-side connection section 28 through the second source-side contact hole 30 formed in the second insulation film 40.

In the third insulation film etching process, as illustrated in FIG. 11, similar to the lower layer-side metal film etching process, the third insulation film 42 is subjected to etching and patterned with using the photoresist disposed on the third insulation film 42, which is formed through the third insulation film forming process, and subjected to patterning. In the etching process, in addition to the third insulation film 42, the second insulation film 40 and the first insulation film 38 that are included in the lower layer side of the third insulation film 42 are also subjected to etching with using the above photoresist. Accordingly, the first source-side contact holes 21 are formed in the first insulation film 38, the second insulation film 40, and the third insulation film 42 so as to overlap the first source region 15B and to be communicated with one another, and the first drain-side contact holes 22 are formed in the insulation films so as to overlap the first drain region 15C and to be communicated with one another. The first drain opposite-side contact holes 23 are formed in the second insulation film 40 and the third insulation film 42 so as to overlap the first drain line 18 and to be communicated with each other.

As illustrated in FIG. 11, until the subsequent second metal film forming process is performed after the third insulation film etching process, the first source region 15B and the first drain region 15C formed from the first semiconductor film 37 are respectively exposed through the first source-side contact holes 21 and the first drain-side contact holes 22 formed in the first insulation film 38, the second insulation film 40, and the third insulation film 42. Therefore, an oxide may be created on surfaces of the first source region 15B and the first drain region 15C. In such a case, a hydrofluoric acid cleaning process is preferably performed to remove the oxide. In the hydrofluoric acid cleaning process, the surfaces of the first source region 15B and the first drain region 15C are cleaned with hydrofluoric acid through the first source-side contact holes 21 and the first drain-side contact holes 22. The second source region 24B, the second drain region 24C, and the second channel region 24D that are formed through the second semiconductor film etching process are covered with the third insulation film 42 and therefore, they are less likely to be damaged by the hydrofluoric acid cleaning process. Specifically, before the second metal film forming process is performed, the third insulation film 42 has the first source-side contact hole 21, the first drain-side contact hole 22, and the first drain opposite-side contact hole 23; however, the third insulation film 42 does not have the second drain-side contact hole 31 (refer FIG. 5) in a section overlapping the second drain region 24C. The second source-side contact hole 30 is formed in the section of the second insulation film 40 overlapping the second source region 24B but is not formed in the third insulation film 42. Thus, the second source region 24B, the second drain region 24C and the second channel region 24D that are formed from the second semiconductor film 41 are covered with the third insulation film 42 and are not exposed. Therefore, unlike a conventional structure, the sacrificial layer is not necessary to be formed for preventing the semiconductor film from being damaged by the hydrofluoric acid cleaning or the sacrificial is not necessary subjected to etching twice.

Figure 12:
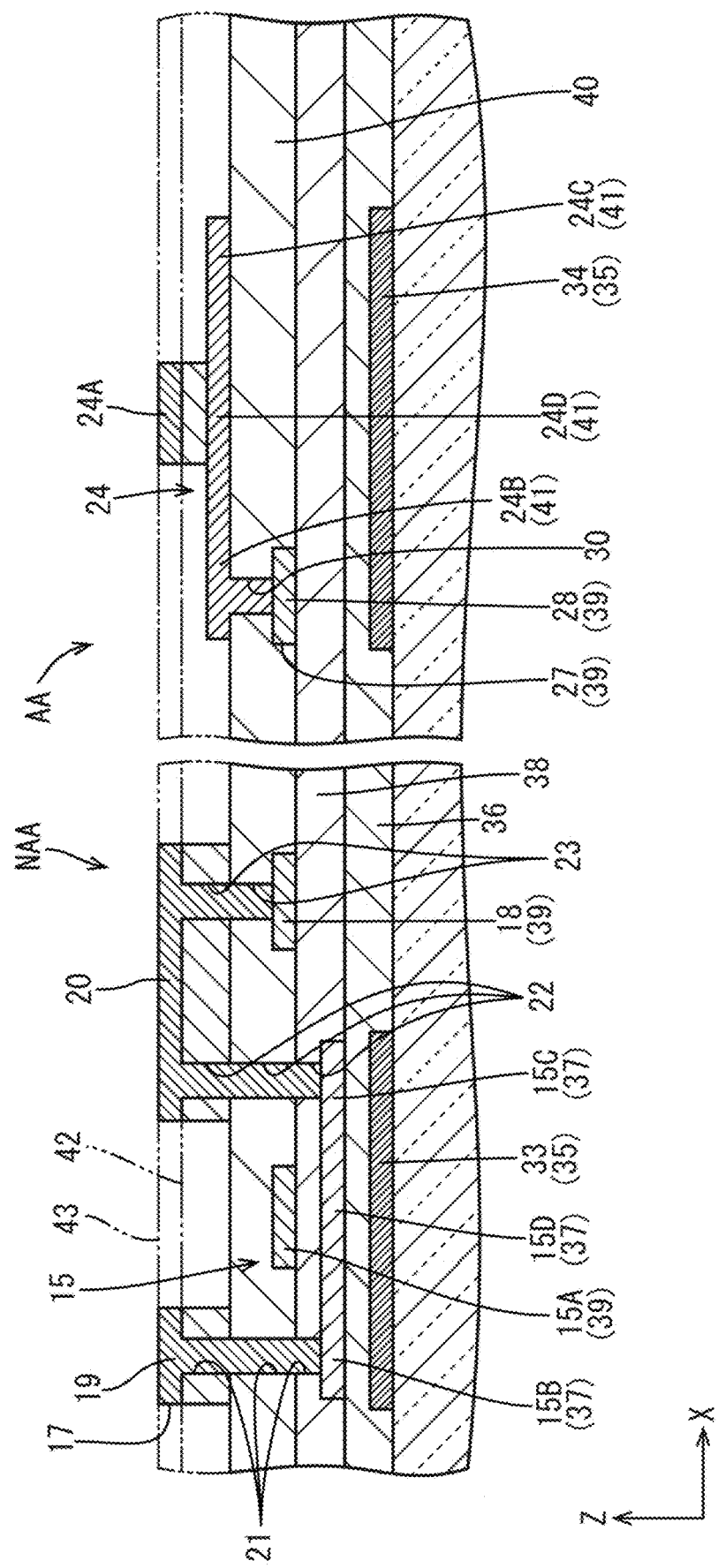
FIG. 12 is a cross-sectional view of the array substrate that has been subjected to a second metal film forming process and a second metal film etching process in the method of producing an array substrate.

Subsequently, after the second metal film 43 is formed through the second metal film forming process, the second metal film etching process is performed. In the second metal film etching process, as illustrated in FIG. 12, similar to the lower layer-side metal film etching process, the second metal film 43 is subjected to etching and patterned with using the photoresist that is disposed on the second metal film 43 and subjected to patterning. In the etching process, in addition to the second metal film 43, the third insulation film 42 that is included on the lower layer side of the second metal film 43 is also subjected to etching with using the above photoresist. Accordingly, the first source-side connection section 19, the first drain-side connection section 20, the second gate electrode 24A, and the second gate line 26 that are formed from the second metal film 43 are formed. The first source-side connection section 19 is connected to the first source region 15B through the first source-side contact hole 21. One end section of the first drain-side connection section 20 is connected to the first drain region 15C through the first drain-side contact hole 22 and another end section thereof is connected to the first drain line 18 through the first drain opposite-side contact hole 23. Sections of the third insulation film 42 except for the sections overlapping the first source-side connection section 19, the first drain-side connection section 20, the second gate electrode 24A, and the second gate line 26 (except for the first source-side contact hole 21, the first drain-side contact hole 22, and the first drain opposite-side contact hole 23) are removed with etching in the second metal film etching process. Therefore, the second source region 24B and the second drain region 24C formed from the second semiconductor film 41, which is disposed on a lower layer side of the third insulation film 42, are not covered with the third insulation film 42 and are exposed. However, the second channel region 24D is covered with the second gate electrode 24A and the third insulation film 42 and is not exposed.

Figure 13:
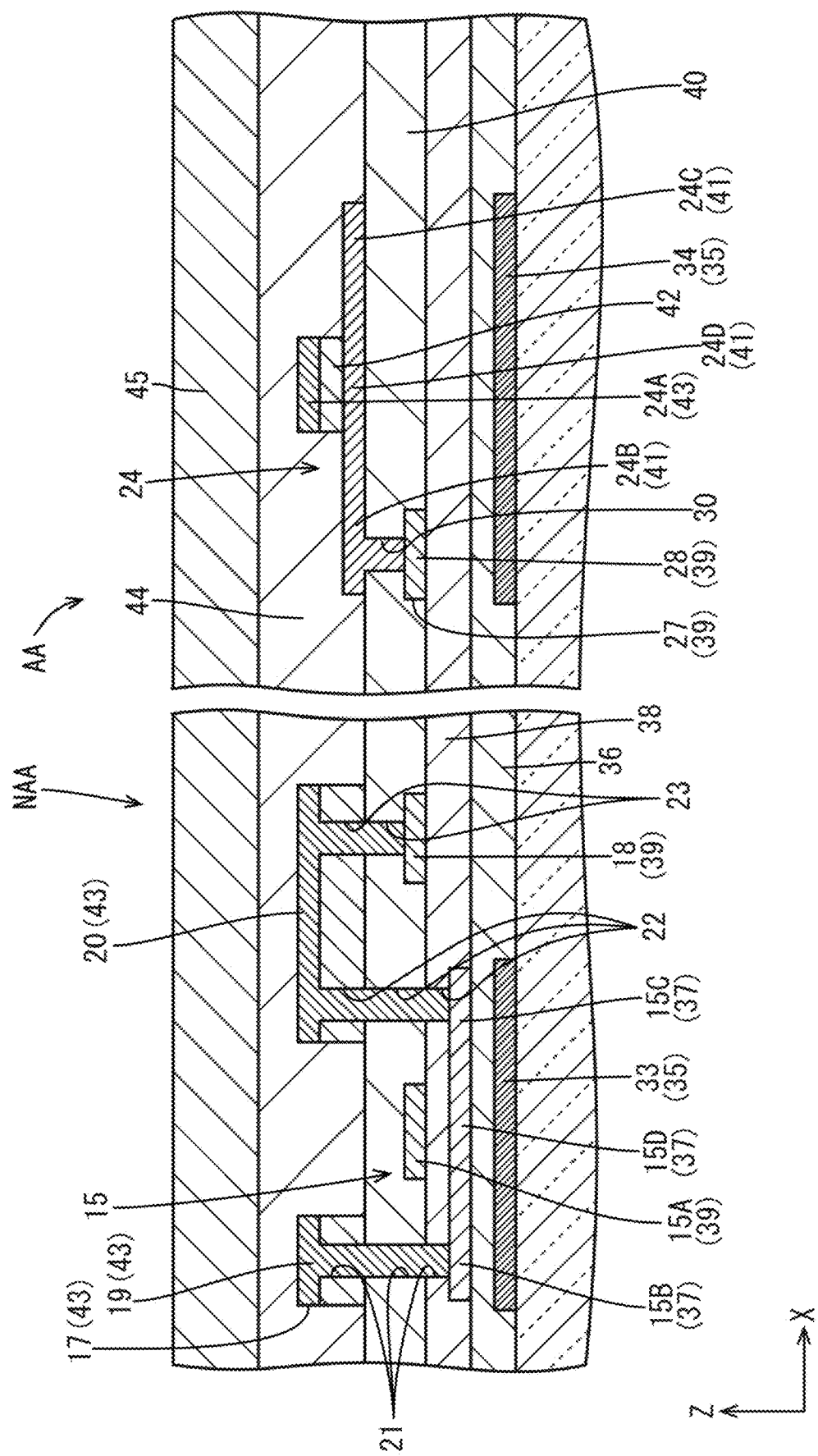
FIG. 13 is a cross-sectional view of the array substrate that has been subjected to a fourth insulation film forming process and a fifth insulation film forming process in the method of producing an array substrate.

After the fourth insulation film forming process and the fifth insulation film forming process are subsequently performed, as illustrated in FIG. 13, the fourth insulation film 44 and the fifth insulation film 45 are successively stacked on each other and formed. The fourth insulation film 44 is disposed to cover the second metal film 43 from the upper layer side and cover from the upper layer side an uncovered part of the second semiconductor film 41 (the second source region 24B and the second drain region 24C) and an uncovered part of the second insulation film 40 that are exposed by removing the second metal film 43 and the third insulation film 42 in the previous second metal film etching process. Since the material of the fourth insulation film 44 at least includes silicon nitride, the fourth insulation film 44 contains hydrogen. Therefore, hydrogen contained in the fourth insulation film 44 will be introduced into the second source region 24B and the second drain region 24C, which are formed from the second semiconductor film 41 not covered with the second gate electrode 24A and the third insulation film 42, as time passes. Accordingly, resistances of the second source region 24B and the second drain region 24C that are formed from the second semiconductor film 41 are selectively lowered as time passes.

Figure 14:
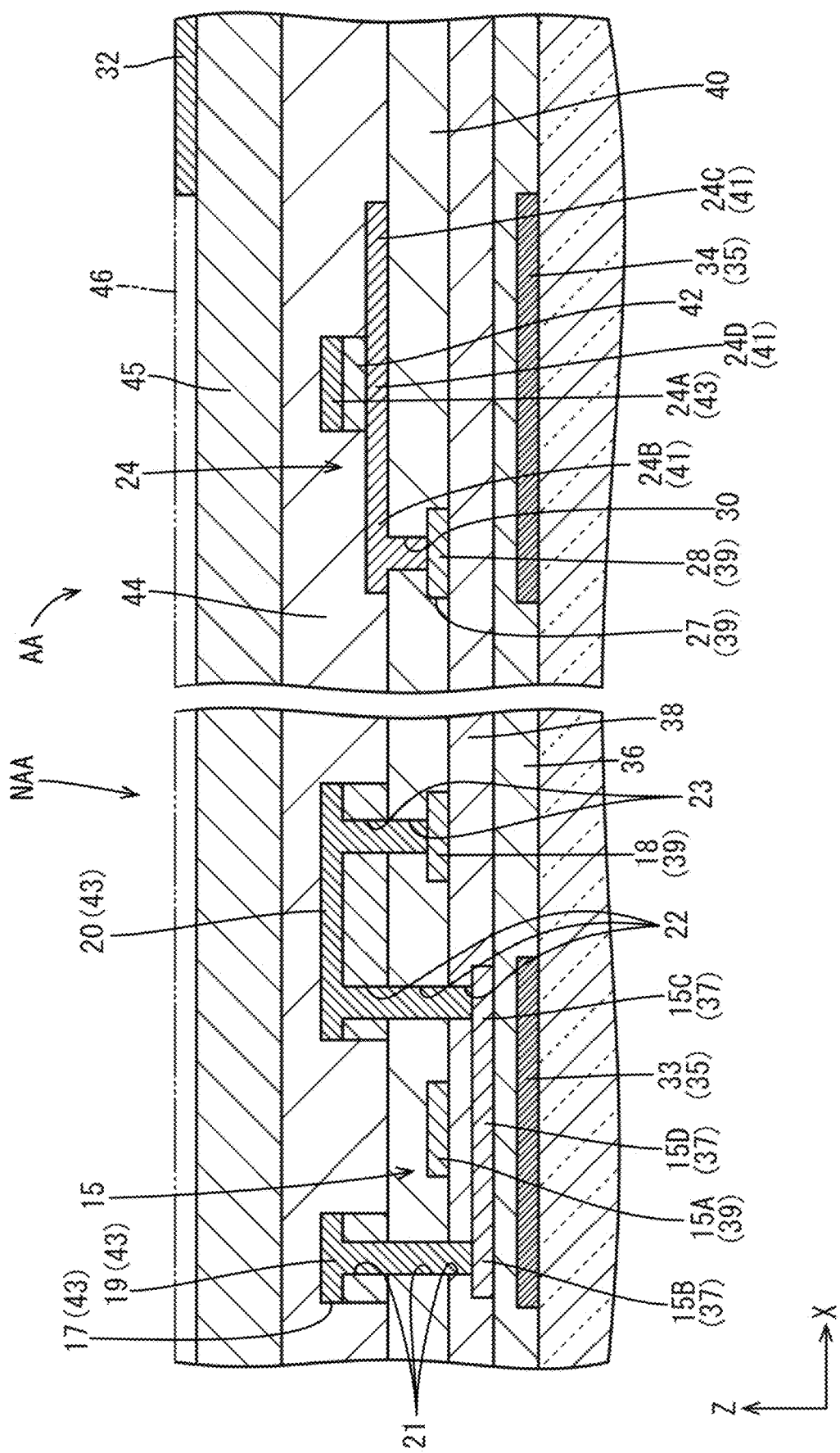
FIG. 14 is a cross-sectional view of the array substrate that has been subjected to a first transparent electrode film forming process and a first transparent electrode film etching process in the method of producing an array substrate.
Figure 15:
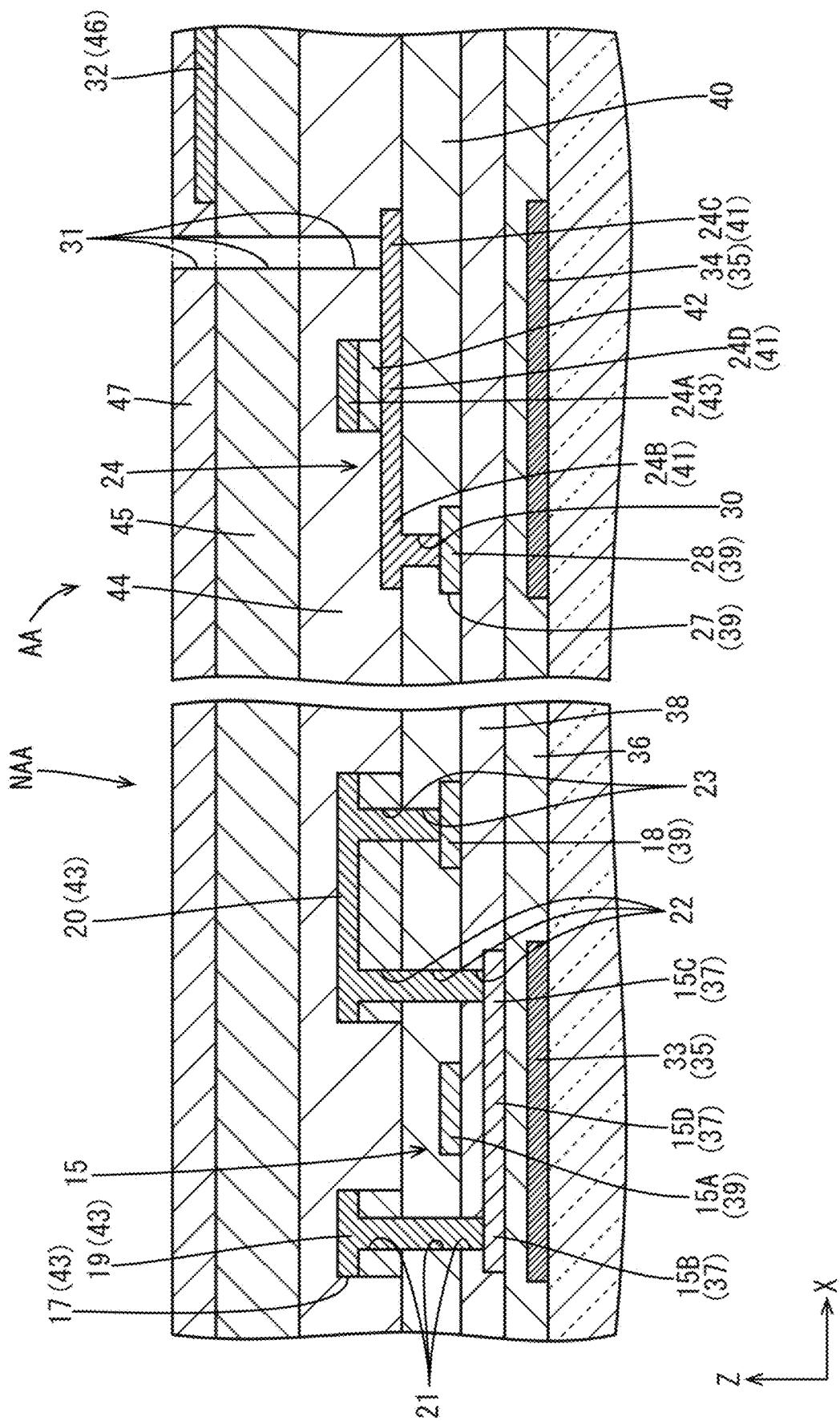
FIG. 15 is a cross-sectional view of the array substrate that has been subjected to a sixth insulation film forming process and a sixth insulation film etching process in the method of producing an array substrate.
Figure 16:
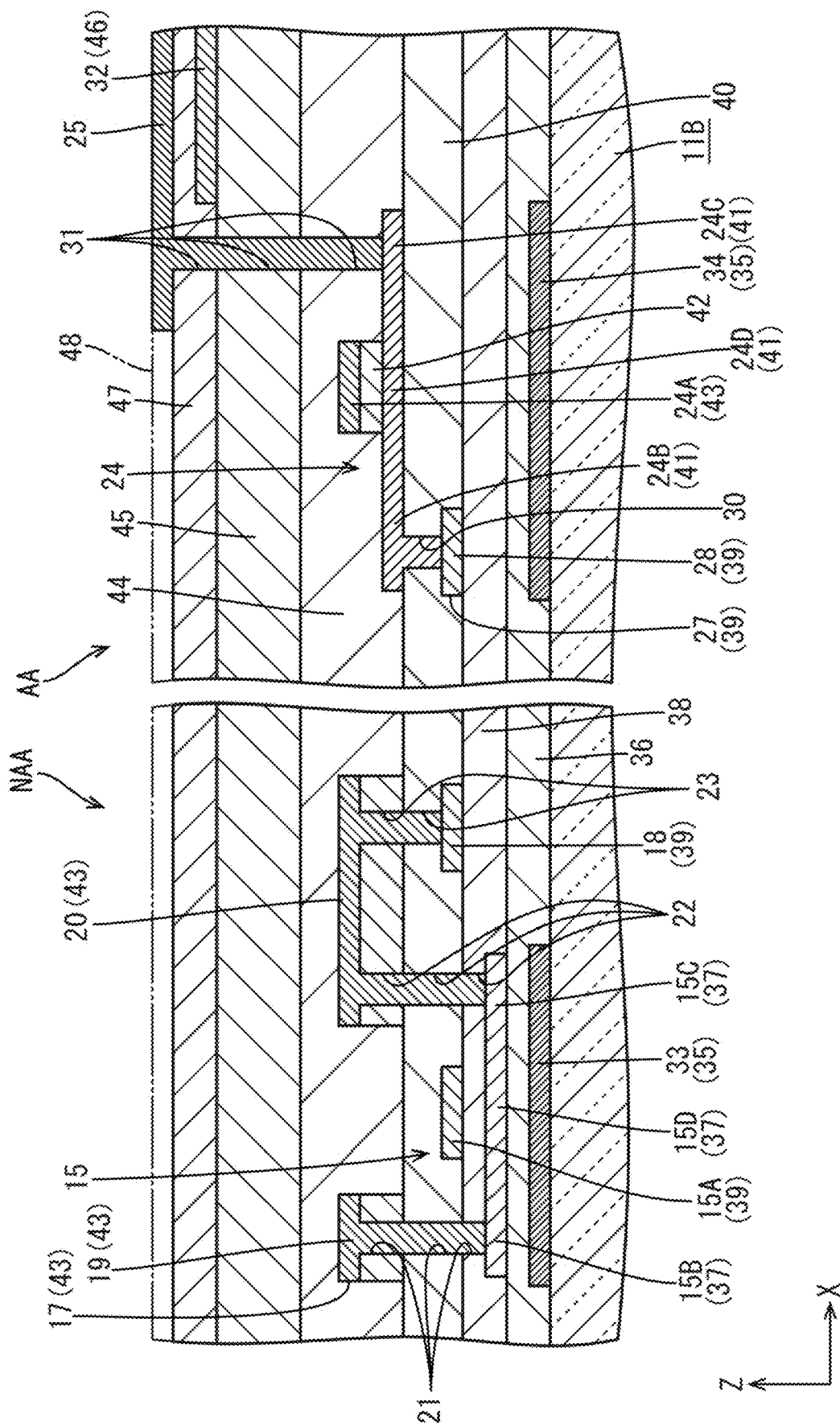
FIG. 16 is a cross-sectional view of the array substrate that has been subjected to a second transparent electrode film forming process and a second transparent electrode film etching process in the method of producing an array substrate.

In the first transparent electrode film etching process, as illustrated in FIG. 14, similar to the lower layer-side metal film etching process, the first transparent electrode film 46 is subjected to etching and patterned with using the photoresist disposed on the first transparent electrode film 46, which is formed through the first transparent electrode film forming process, and subjected to patterning. Accordingly, the common electrode 32 formed from the first transparent electrode film 46 is formed. Thereafter, in the sixth insulation film etching process, as illustrated in FIG. 15, similar to the lower layer-side metal film etching process, the sixth insulation film 47 is subjected to etching and patterned with using the photoresist disposed on the sixth insulation film 47, which is formed through the sixth insulation film forming process, and subjected to patterning. In the sixth insulation film etching process, the fourth insulation film 44 and the fifth insulation film 45 in addition to the sixth insulation film 47 are subjected to etching. Therefore, it can be said that the sixth insulation film etching process substantially includes the fourth insulation film etching process and the fifth insulation film etching process. The second drain-side contact holes 31 are formed in sections of the fourth insulation film 44, the fifth insulation film 45, and the sixth insulation film 47 overlapping the second drain region 24C to be communicated with one another. Then, in the second transparent electrode film etching process, as illustrated in FIG. 16, similar to the lower layer-side metal film etching process, the second transparent electrode film 48 is subjected to etching and patterned with using the photoresist disposed on the second transparent electrode film 48, which is formed through the second transparent electrode film forming process, and subjected to patterning. Accordingly, the pixel electrode 25 (including the second drain-side connection section 29) that is formed from the second transparent electrode film 48 is formed. The second drain-side connection section 29 included in the pixel electrode 25 is connected to the second drain region 24C through the second drain-side contact holes 31 that are formed in the fourth insulation film 44, the fifth insulation film 45, and the sixth insulation film 47.

As described before, the array substrate (the semiconductor device) 11B of the present embodiment includes the first semiconductor film 37, the first insulation film 38 disposed on an upper layer side of the first semiconductor film 37, the first metal film 39 disposed on an upper layer side of the first insulation film 38, the second insulation film 40 disposed ton an upper layer side of the first metal film 39, the second semiconductor film 41 dispose on an upper layer side of the second insulation film, the third insulation film 42 disposed on an upper layer side of the second semiconductor film 41, the second metal film 43 disposed on an upper layer side of the third insulation film 42, the fourth insulation film 44 disposed on an upper layer side of the second metal film 43, the second transparent electrode film (transparent electrode film) 48 disposed on an upper layer side of the fourth insulation film 44, the first TFT 15 including the first gate electrode 15A that is a part of the first metal film 39, the first channel region 15D that is a part of the first semiconductor film 37 and disposed to overlap the first gate electrode 15A, the first source region 15B that is a part of the first semiconductor film 37 and is continuous from the first channel region 15D, and the first drain region 15C that is a part of the first semiconductor film 37 and is continuous from an opposite end from the first source region 15B with respect to the first channel region 15D, the first source-side connection section 19 that is a part of the second metal film 43 and disposed to overlap the first source region 15B and connected to the first source region 15B through the first source-side contact holes 21 formed in the first insulation film 38, the second insulation film 40, and the third insulation film 42, the first drain-side connection section 20 that is a part of the second metal film 43 and disposed to overlap a first drain region 14C and connected to the first drain region 14C through the first drain-side contact holes 22 formed in the first insulation film 38, the second insulation film 40, and the third insulation film 42, the second TFT 24 driven by the first TFT 15 and including the second gate electrode 24A that is a part of the second metal film 43, the second channel region 24D that is a part of the second semiconductor film 41 and disposed to overlap the second gate electrode 24A, the second source region 24B that is a part of the second semiconductor film 41 and continuous from the second channel region 24D, and the second drain region 24C that is a part of the second semiconductor film 41 and continuous from an opposite end from the second source region 24B with respect to the second channel region 24D, the second source-side connection section 28 that is a part of the first metal film 39 and disposed to overlap the second source region 24B and connected to the second source region 24B through the second source-side contact hole 30 formed in the second insulation film 40, and the second drain-side connection section 29 that is a part of the second transparent electrode film 48 and disposed to overlap the second drain region 24C and connected to the second drain region 24C through the second drain-side contact hole 31 formed in at least the fourth insulation film 44.

If the first TFT 15 is driven according to power supply to the first gate electrode 15A, electrons move between the first source region 15B connected to the first source-side connection section 19 and the first drain region 15C connected to the first drain-side connection section 20 through the first channel region 15D. If power is supplied to the second gate electrode 24A according to the driving of the first TFT 15, the second TFT 24 is driven. Then, electrons move between the second source region 24B connected to the second source-side connection section 28 and the second drain region 24C connected to the second drain-side connection section 29 through the second channel region 24D.

Before the second metal film 43 is formed during the production process, the first source region 15B and the first drain region 15C formed from the first semiconductor film 37 are respectively exposed through the first source-side contact holes 21 and the first drain-side contact holes 22. Therefore, an oxide may be created on surfaces of the first source region 15B and the first drain region 15C. In such a case, a hydrofluoric acid cleaning process is preferably performed to remove the oxide. In the hydrofluoric acid cleaning process, the surfaces of the first source region 15B and the first drain region 15C are cleaned with hydrofluoric acid through the first source-side contact holes 21 and the first drain-side contact holes 22. The second source region 24B and the second drain region 24C that are formed from the second semiconductor film 41 are covered with the third insulation film 42 and therefore, they are less likely to be damaged by the hydrofluoric acid cleaning process.

Specifically, since the second source region 24B is connected to the second source-side connection section 28 through the second source-side contact hole 30 formed in the second insulation film 40, the second source region 24B is covered with the third insulation film 42 and is not exposed before the forming of the second metal film 43. Since the second drain-side contact hole 31 is at least formed in the fourth insulation film 44, the second source-side contact hole 30 is not formed in the third insulation film 42 and the second drain region 24C is covered with the third insulation film 42 and is not exposed at least before the forming of the second metal film. Therefore, unlike a conventional structure, the sacrificial layer is not necessary to be formed for preventing the semiconductor film from being damaged by the hydrofluoric acid cleaning or the sacrificial is not necessary subjected to etching twice.

Furthermore, the contact holes 21, 22, 23 for the first TFT 15 are formed separately from the contact holes 30, 31 for the second TFT 24. Therefore, even if the number of insulation films that are to be etched for forming the contact holes 21, 22, 23, 30, 31 differs between the first TFT 15 and the second TFT 24, each of the contact holes 21, 22, 23, 30, 31 can be formed with an appropriate depth. Further, the first source-side connection section 19, the first drain-side connection section 20, and the second gate electrode 24A of the second TFT 24 are formed from the second metal film 43 and at least two of the first gate electrode 15A of the first TFT 15 and the second source-side connection section 28 are formed from the first metal film 39. Therefore, compared to a configuration that all of them are formed from different metal films, the number of metal films is decreased and a cost is preferably reduced.

The first drain line (the first drain opposite-side connection section) 18 that is formed from the first metal film 39 is connected to the end of the first drain-side connection section 20 opposite from the first drain region 15C side end through the first drain opposite-side contact holes 23 formed in the second insulation film 40 and the third insulation film 42. According to such a configuration, if the first TFT 15 is driven and electrons move from the first source region 15B to the first drain region 15C through the first channel region 15D, the electrons move to the first drain line 18 that is connected to the first drain-side connection section 20 through the first drain opposite-side contact hole 23. Since the first drain line 18 is formed from the first metal film 39 that forms the first gate electrode 15A and the second source-side connection section 28, the number of metal films is further decreased and a cost is further reduced appropriately.

The first semiconductor film 37 is a polycrystalline silicone film. The polycrystalline silicone film tends to have higher electron mobility compared to an amorphous silicon film or an oxide semiconductor film. Since the first channel region 15D of the first TFT 15 is formed from the polycrystalline silicone film having high electron mobility, the second TFT 24 can be appropriately driven by the first TFT 15.

The second semiconductor film 41 is formed from the oxide semiconductor film, and the second source region 24B and the second drain region 24C are formed by lowering resistance of the sections of the second semiconductor film 41. Compared to the polycrystalline silicone film, the oxide semiconductor film is easily formed in a large area. Since the second channel region 24D of the second TFT 24 is formed from the oxide semiconductor film, the second TFT 24 that is driven by the first TFT 15 is appropriately disposed in a large area. The oxide semiconductor film that is subjected to the resistance lowering treatment can make a desired region thereof to have low resistance. Therefore, the second source region 24B and the second drain region 24C that are continuous from the second channel region 24D are obtained by lowering the resistance of the sections of the second semiconductor film 41 such that movement of electrons is smoother.

The liquid crystal panel (the display device) 11 of the present embodiment includes the array substrate 11B as described before, the display region AA displaying images, and the non-display region NAA displaying no image. According to the liquid crystal panel 11 having such a configuration, images are displayed on the display region AA while no image is displayed on the non-display region NAA.

At least the second TFT 24, the second source-side connection section 28, and the second drain-side connection section 29 are disposed in the display region AA and the second drain-side connection section 29 is formed from the second transparent electrode film 48 and forms the pixel electrode 25. According to such a configuration, if the second TFT 24 disposed in the display region AA is driven by the first TFT 15, the pixel electrode 25 that is formed by the second drain-side connection section 29 is charged such that images are displayed on the display region AA.

The second TFT 24 is arranged in the display region AA and at least includes the lower layer-side insulation film 36 disposed on the lower layer side of the first semiconductor film 37, the lower layer-side metal film 35 disposed on the lower layer side of the lower layer-side insulation film 36, and the second light blocking section (the light blocking section) 34 that is formed from the lower layer-side metal film 35 and disposed to overlap at least the second channel region 24D. According to such a configuration, the second channel region 24D that forms the second TFT 24 arranged in the display region AA is supplied from the lower layer side with light that is used for displaying. In such a case, since the second light blocking section 34 that is formed from the lower layer-side metal film 35 disposed on the lower layer side with respect to the first semiconductor film 37 through the lower layer-side insulation film 36 overlaps at least the second channel region 24D that is formed from the second semiconductor film 41. Therefore, the light directed toward the second channel region 24D is blocked by the second light blocking section 34. Accordingly, change in characteristics of the second TFT 24 that may be caused by supply of light to the second channel region 24D is less likely to be caused.

At least the first TFT 15 is arranged in the non-display region NAA and includes the lower layer-side insulation film 36 disposed on the lower layer side of the first semiconductor film 37, the lower layer-side metal film 35 disposed on the lower layer side of the lower layer-side insulation film 36, and the first light blocking section (the light blocking section) 33 that is formed from the lower layer-side metal film 35 and disposed to overlap at least the first channel region 15D. According to such a configuration, the first channel region 15D of the first TFT 15 that is arranged in the non-display region NAA is sometimes covered by the light blocking structure and kept in a light-blocked state but may not be in such a light-blocked state. Even in such a case, the first light blocking section 33 that is formed from the lower layer-side metal film 35 disposed on the lower layer side with respect to the first semiconductor film 37 through the lower layer-side insulation film 36 overlaps at least the first channel region 15D that is formed from the first semiconductor film 37. According to such a configuration, the light directed toward the first channel region 15D is blocked by the first light blocking section 33. Accordingly, change in characteristics of the first TFT 15 that may be caused by supply of light to the first channel region 15D is less likely to be caused.

The method of producing the array substrate 11B according to the present embodiment includes a first semiconductor film forming process of forming the first semiconductor film 37, a first semiconductor film etching process of etching the first semiconductor film 37 and forming the first source region 15B, the first channel region 15D, and the first drain region 15C of the first TFT 15, a first insulation film forming process of forming the first insulation film 38 on the upper layer side of the first semiconductor film 37, a first metal film forming process of forming the first metal film 39 on the upper layer side of the first insulation film 38, a first metal film etching process of etching the first metal film 39 and at least forming the first gate electrode 15A that forms a part of the first TFT 15 and overlapping the first channel region 15D and the second source-side connection section 28 connected to the second TFT 24 that is driven by the first TFT 15, a second insulation film forming process of forming the second insulation film 40 on the upper layer side of the first metal film 39, a second insulation film etching process of etching the second insulation film 40 and forming at least the second source-side contact hole 30 in a section overlapping the second source-side connection section 28, a second semiconductor film forming process of forming the second semiconductor film 41 on the upper layer side of the second insulation film 40, a second semiconductor film etching process of etching the second semiconductor film 41 and forming the second source region 24B that forms a part of the second TFT 24 and connected to the second source-side connection section 28 through the second source-side contact hole 30 and forming the second channel region 24D and the second drain region 24C of the second TFT 24, a third insulation film forming process of forming the third insulation film 42 on the upper layer side of the second semiconductor film 41, a third insulation film etching process of etching the third insulation film 42 together with the first insulation film 38 and the second insulation film 40 and at least forming the first source-side contact hole 21 and the first drain-side contact hole 22 in the sections overlapping the first source region 15B and the first drain region 15C, a second metal film forming process of forming the second metal film 43 on the upper layer side of the third insulation film 42, a second metal film etching process of etching the second metal film 43 together with the third insulation film 42 and at least forming the second gate electrode 24A that forms a part of the second TFT 24 overlapping the second channel region 24D, the first source-side connection section 19 connected to the first source region 15B through the first source-side contact hole 21, and the first drain-side connection section 20 connected to the first drain region 15C through the second drain-side contact hole 31, a fourth insulation film forming process of forming the fourth insulation film 44 on the upper layer side of the second metal film 43, a fourth insulation film etching process of etching the fourth insulation film 44, a second transparent electrode film forming process of forming the second transparent electrode film 48 on the upper layer side of the fourth insulation film 44, and a second transparent electrode film etching process of etching the second transparent electrode film 48. In the fourth insulation film etching process, the second drain-side contact hole 31 is formed in a section of at least the fourth insulation film 44 overlapping the second drain region 24C and in the second transparent electrode film etching process, the second drain-side connection section 29 that is connected to the second drain region 24C through the second drain-side contact hole 31 is formed.

Before the second metal film forming process among the above described processes is performed, the first source region 15B and the first drain region 15C formed from the first semiconductor film 37 are respectively exposed through the first source-side contact holes 21 and the first drain-side contact holes 22. Therefore, an oxide may be created on surfaces of the first source region 15B and the first drain region 15C. In such a case, a hydrofluoric acid cleaning process is preferably performed to remove the oxide. In the hydrofluoric acid cleaning process, the surfaces of the first source region 15B and the first drain region 15C are cleaned with hydrofluoric acid through the first source-side contact holes 21 and the first drain-side contact holes 22. The second source region 24B and the second drain region 24C that are formed through the second semiconductor film etching process are covered with the third insulation film 42 and therefore, they are less likely to be damaged by the hydrofluoric acid cleaning process.

Specifically, the second source region 24B formed in the second semiconductor film etching process is connected to the second source-side connection section 28 through the second source-side contact hole 30 that has been formed in the second insulation film 40 in the previously performed second insulation film etching process. Therefore, before the second metal film 43 is formed, the second source region 24B is covered with the third insulation film 42 and not exposed. The second drain-side connection section 29 is formed in the second transparent electrode film etching process. Therefore, the second drain-side contact hole 31 is formed at least in the fourth insulation film 44 in the fourth insulation film etching process such that the second drain-side connection section 29 is connected to the second drain region 24C. The second source-side contact hole 30 is not formed in the third insulation film 42 at least before the second metal film 43 is formed and therefore, the second drain region 24C is covered with the third insulation film 42 and is not exposed. Therefore, unlike a conventional structure, the sacrificial layer is not necessary to be formed for preventing the semiconductor film from being damaged by the hydrofluoric acid cleaning or the sacrificial is not necessary subjected to etching twice.

Furthermore, the contact holes 21, 22, 23 for the first TFT 15 are formed separately from the contact holes 30, 31 for the second TFT 24. Therefore, even if the number of insulation films that are to be etched for forming the contact holes 21, 22, 23, 30, 31 differs between the first TFT 15 and the second TFT 24, each of the contact holes 21, 22, 23, 30, 31 can be formed with an appropriate depth. Further, the first source-side connection section 19, the first drain-side connection section 20, and the second gate electrode 24A of the second TFT 24 are formed from the second metal film 43 and at least two of the first gate electrode 15A of the first TFT 15 and the second source-side connection section 28 are formed from the first metal film 39. Therefore, compared to a configuration that all of them are formed from different metal films, the number of metal films is decreased and a cost is preferably reduced.

In the fourth insulation film forming process, the material of the fourth insulation film 44 includes at least silicon nitride. Since the material of the fourth insulation film 44 at least includes silicon nitride, the fourth insulation film 44 contains hydrogen. Therefore, hydrogen contained in the fourth insulation film 44 will be introduced into the second source region 24B and the second drain region 24C that are not covered with the second gate electrode 24A and the third insulation film 42 as time passes. Accordingly, resistances of the second source region 24B and the second drain region 24C that are formed from the second semiconductor film 41 can be selectively lowered.

Second Embodiment

A second embodiment of the present technology will be described with reference to FIG. 17. The second embodiment further includes a lower layer-side gate electrode 49.

Configurations, operations, and effects similar to those of the first embodiment will not be described.

Figure 17:
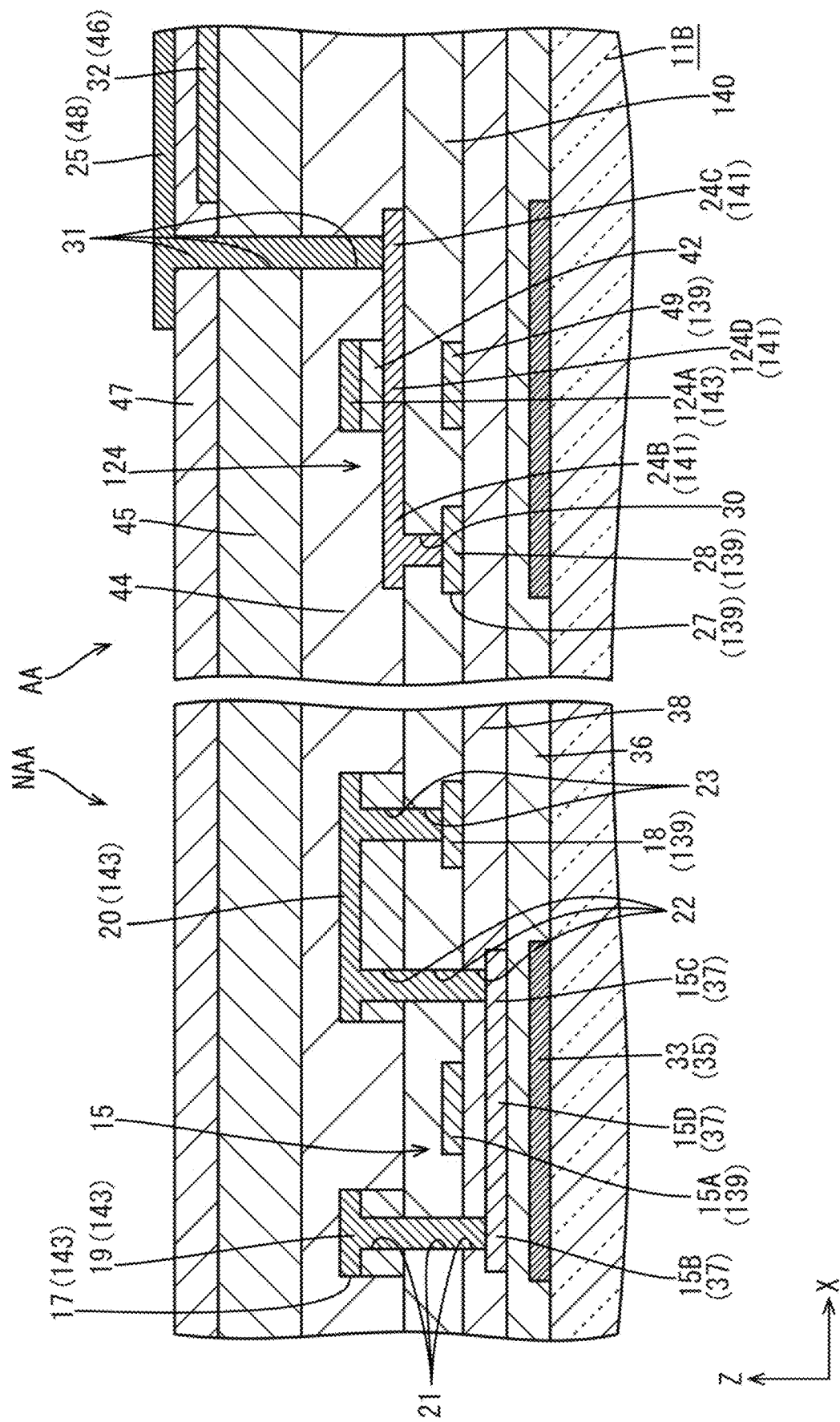
FIG. 17 is a cross-sectional view illustrating a first TFT and a second TFT included in an array substrate according to a second embodiment of the present technology.

As illustrated in FIG. 17, a second TFT 124 according to the present embodiment includes the lower layer-side gate electrode 49 and has a so-called double gate structure. The lower layer-side gate electrode 49 is formed from a first metal film 139 that is on a lower layer side of a second semiconductor film 141 of a second channel region 124D while having a second insulation film 140 therebetween. The lower layer-side gate electrode 49 is disposed to overlap both of a second gate electrode 124A and the second channel region 124D. Therefore, the second channel region 124D is disposed between the lower layer-side gate electrode 49 on the lower layer side thereof and the second gate electrode 124A on an upper layer side thereof. The lower layer-side gate electrode 49 is connected to the second gate electrode 124A that is formed from the second metal film 143 through an electrode in-between connection section. According to such a configuration, scan signals transmitted to a second gate line 126 that is formed from the second metal film 143 is supplied to the second gate electrode 124A and the lower layer-side gate electrode 49 at a same timing. This increases a flow amount of electrons flowing through the second channel region 124D that overlaps the second gate electrode 124A and the lower layer-side gate electrode 49.

According to the present embodiment, as described before, a second light blocking section 134 is the lower layer-side gate electrode 49 that can drive the second TFT 124. Accordingly, the flow amount of electrons flowing through the second channel region 124D that overlaps the lower layer-side gate electrode 49 is increased since the signals are supplied to the lower layer-side gate electrode 49 in addition to the second gate electrode 124A.

Third Embodiment

A third embodiment of the present technology will be described with reference to FIG. 18. In the third embodiment, a lower layer-side metal film is removed from the first embodiment. Configurations, operations, and effects similar to those of the first embodiment will not be described.

Figure 18:
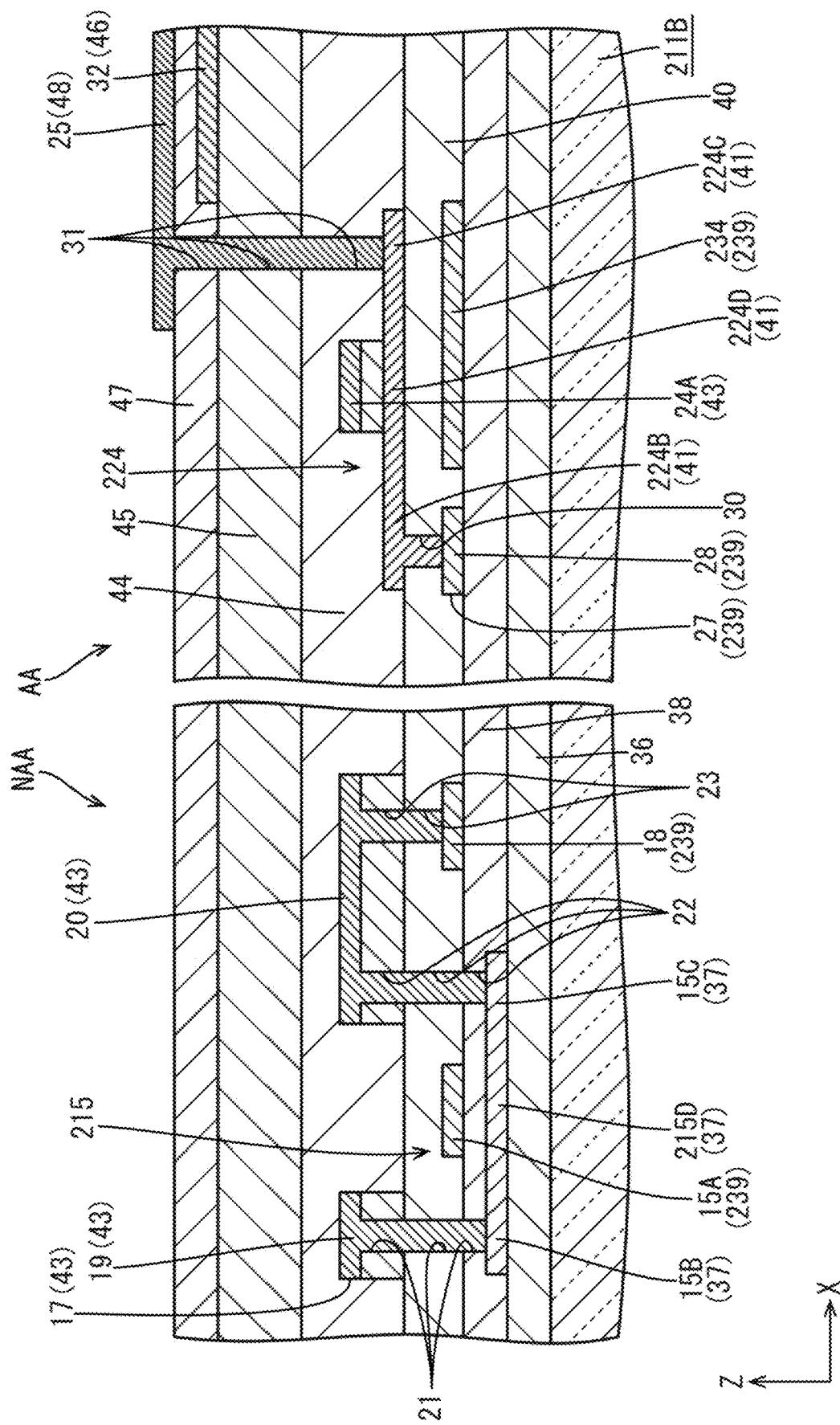
FIG. 18 is a cross-sectional view illustrating a first TFT and a second TFT included in an array substrate according to a third embodiment of the present technology.

As illustrated in FIG. 18, an array substrate 211B according to the present embodiment has a configuration that the lower layer-side metal film (refer FIG. 3 and FIG. 5) described in the first embodiment section is removed. According to such a configuration, the number of metal films included in the array substrate 211B is reduced and it is preferable to reduce a cost. Accordingly, in the present embodiment, the first light blocking section (refer FIG. 3 and FIG. 5) described in the first embodiment section is removed. Such a configuration is effectively used in a configuration that a first channel region 215D of a first TFT 215 arranged in the non-display region NAA of the array substrate 211B is covered by a light blocking structure disposed outside the liquid crystal panel and is quite likely to be kept in a light blocked state. On the other hand, in the present embodiment, a second light blocking section 234 is not removed and is formed from a first metal film 239. The second light blocking section 234 formed from the first metal film 239 overlaps a part of a second source region 224B, a second drain region 224C, and a second channel region 224D of a second TFT 224 on a lower layer side of them. The second TFT 224 arranged in the display region AA of the array substrate 211B is supplied with light from a backlight device but is blocked from light by the second light blocking section 234 such that each of the regions 224B to 224D is less likely to be deteriorated (optically deteriorated).

Fourth Embodiment

A fourth embodiment of the present technology will be described with reference to FIG. 19. In the fourth embodiment, an outline shape of a liquid crystal panel 311 and arrangement of gate circuits 314 are altered from those of the first embodiment. Configurations, operations, and effects similar to those of the first embodiment will not be described.

Figure 19:
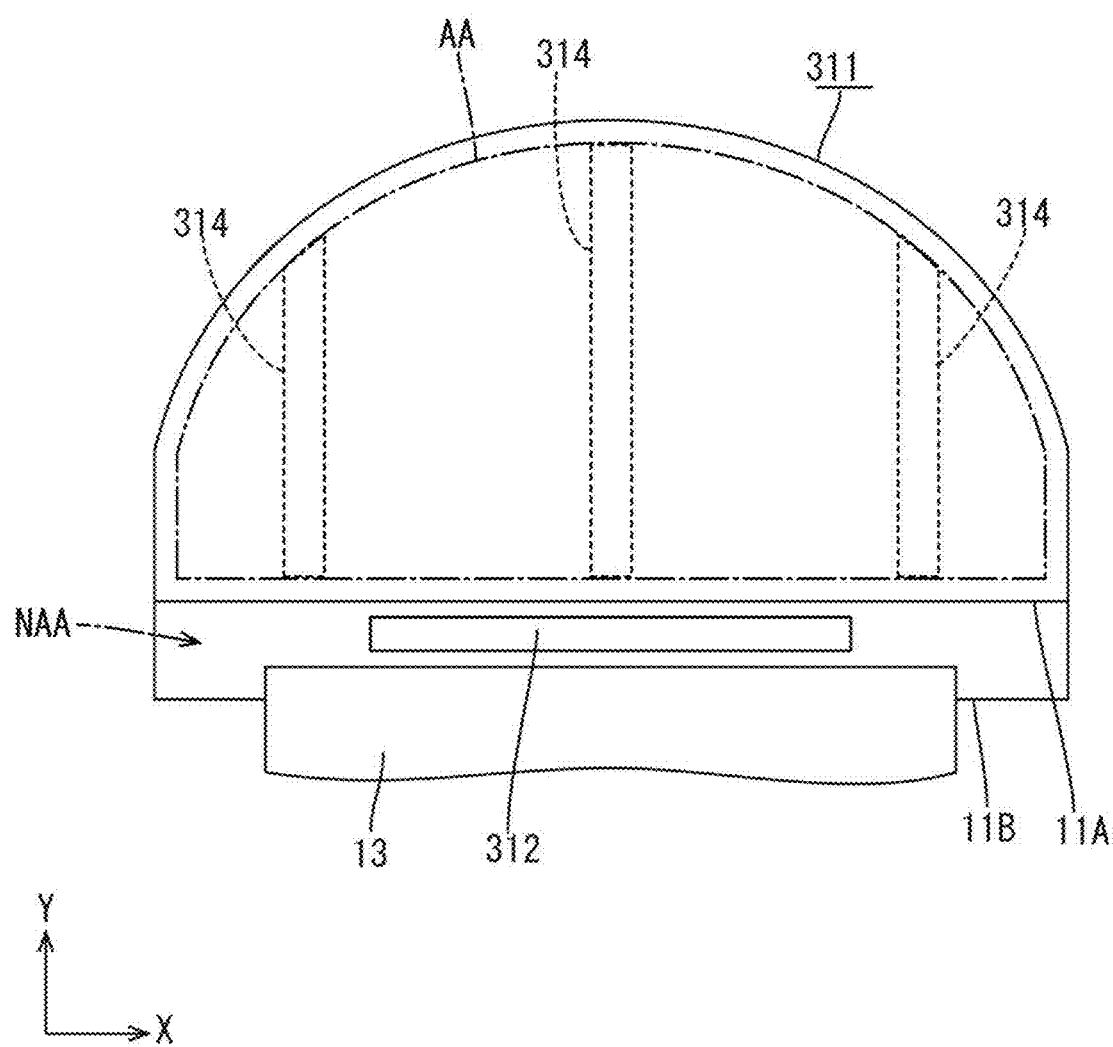
FIG. 19 is a plan view illustrating a liquid crystal panel, a driver, and a flexible circuit board included in a liquid crystal display device of the present technology.

As illustrated in FIG. 19, the liquid crystal panel 311 according to the present embodiment has a substantially semi-circular plan view shape as a whole. Specifically, the liquid crystal panel 311 has a substantially quadrangular outline in a substantially lower half section (on a driver 312 side) in FIG. 19 and has a substantially arched outline in a substantially upper half section (on an opposite side from the driver 312 side). The gate circuits 314 are arranged in the display region AA of the liquid crystal panel 311 having such a planar shape. Specifically, the gate circuit 314 has a belt-like shape extending in the Y-axis direction and the multiple gate circuits 314 (three in FIG. 19) are arranged in the display region AA at intervals in the X-axis direction. Each of the gate circuits 314 extends while crossing all of the second gate lines that are arranged in the Y-axis direction in the display region AA so as to supply scan signals sequentially to the second gate lines. Thus, the gate circuits 314 are arranged dispersedly in the X-axis direction in the display region AA. With such a configuration, even if the section of the liquid crystal panel 311 on the opposite side from the driver 312 side has a substantially arched outline, the scan signals are supplied to all of the second gate lines from each of the gate circuits 314. Namely, the gate circuits 314 are arranged in the display region AA such that a planar shape of the section of the liquid crystal panel 311 on the opposite side from the driver 312 side can be selected from large varieties.

The gate circuits 314 of the present embodiment are arranged in the display region AA of the liquid crystal panel 311. Therefore, similar to the second TFT, the first TFT included in the gate circuit 314 is supplied with light from a backlight device but is blocked from light by the first light blocking section (refer FIG. 3) such that the first source region, the first drain region, and the first channel region are less likely to be deteriorated.

According to the present embodiment, as described before, at least the first TFT is arranged in the display region AA and includes a lower layer-side insulation film disposed on a lower layer side of a first semiconductor film, a lower layer-side metal film disposed on a lower layer side of the lower layer-side insulation film, and the first light blocking section that is formed from the lower layer-side metal film and disposed to overlap at least a first channel region. According to such a configuration, the first channel region that forms a part of the first TFT arranged in the display region AA is supplied with light from the lower layer side used for displaying. Even in such a case, the first light blocking section that is formed from the lower layer-side metal film disposed on the lower layer side with respect to the first semiconductor film through the lower layer-side insulation film overlaps at least the first channel region that is formed from the first semiconductor film. According to such a configuration, the light directed toward the first channel region is blocked by the first light blocking section.

Accordingly, change in characteristics of the first TFT that may be caused by supply of light to the first channel region is less likely to be caused.

Fifth Embodiment

A fifth embodiment of the present technology will be described with reference to FIG. 20. In the fifth embodiment, a second drain connection section 429 has a structure that is altered from the first embodiment. Configurations, operations, and effects similar to those of the first embodiment will not be described.

As illustrated in FIG. 20, the second drain connection section 429 according to the present embodiment is formed from a part of a first metal film 439. The second drain connection section 429 is disposed such that one end thereof overlaps a part of a second drain region 424C and other end thereof overlaps a part of a pixel electrode 425. According to such a structure, a second insulation film 440 that is between the first metal film 439 and a second semiconductor film 441 has a second drain-side contact hole 431 in a section overlapping the second drain connection section and the second drain region 424C. The second drain connection section 429 is connected to the second drain region 424C through the second drain-side contact hole 431. Pixel electrode-side contact holes 50 are formed in the second insulation film 440, which is between the first metal film 439 and a second transparent electrode film 448, a fourth insulation film 444, a fifth insulation film 445, and a sixth insulation film 447 so as to overlap the second drain connection section 429 and the pixel electrode 425 and to be communicated with one another. The pixel electrode 425 is connected to the second drain connection section 429 through the pixel electrode-side contact holes 50.

According to such a structure, in the present embodiment, in a first metal film etching process included in a method of producing an array substrate 411B, the second drain-side connection section 429 is formed in addition to a first gate electrode 415A, a first gate line 416, a first drain line 418, a second source-side connection section, and a second source line 427. In a second insulation film etching process, the second drain-side contact hole 431 is formed in the second insulation film 440 in addition to a second source-side contact hole 430. Accordingly, after a second semiconductor film forming process and a second semiconductor film etching process are subsequently performed, a second source region 424B that is formed from the second semiconductor film 441 is connected to a second source-side connection section 428 through the second source-side contact hole 430 and the second drain region 424C is connected to the second drain-side connection section 429 through the second drain-side contact hole 431. In a sixth insulation film etching process, the second insulation film 440, the fourth insulation film 444, and the fifth insulation film 445 in addition to the sixth insulation film 447 are subjected to etching such that the pixel electrode-side contact holes 50 are formed in the insulation films 440, 444, 445, 447 so as to be communicated with one another. After a second transparent electrode film forming process and a second transparent electrode film etching process are subsequently performed, the pixel electrode 425 that is formed from the second transparent electrode film 448 is connected to the second drain connection section 429 through the pixel electrode-side contact holes 50.

As described before, the array substrate 411B according to the present embodiment differs from the array substrate 11B (refer FIG. 5) according to the first embodiment as follows. The array substrate 411B includes the second drain-side connection section 429 that is formed from a part of the first metal film 439 and disposed to overlap the second drain region 424C and connected to the second drain region 424C through the second drain-side contact hole 431 that is formed in the second insulation film 440.

Before the second metal film 443 is formed in the production process, a first source region 415B and a first drain region 415C formed from the first semiconductor film 437 are respectively exposed through first source-side contact holes 421 and first drain-side contact holes 422. Therefore, an oxide may be created on surfaces of the first source region 415B and the first drain region 415C. In such a case, a hydrofluoric acid cleaning process is preferably performed to remove the oxide. In the hydrofluoric acid cleaning process, the surfaces of the first source region 415B and the first drain region 415C are cleaned with hydrofluoric acid through the first source-side contact holes 421 and the first drain-side contact holes 422. The second source region 424B and the second drain region 424C that are formed from the second semiconductor film 441 are covered with the third insulation film 442 and therefore, they are less likely to be damaged by the hydrofluoric acid cleaning process.

Specifically, the second source region 424B is connected to the second source-side connection section 428 through the second source-side contact hole 430 that is formed in the second insulation film 440. Therefore, before the second metal film 443 is formed, the second source region 424B is covered with the third insulation film 442 and not exposed. The second drain-side contact hole 431 is formed in the second insulation film 440 and therefore, similar to the second source region 424B, the second drain region 424C is covered with the third insulation film 442 and is not exposed before the second metal film 443 is formed. Therefore, unlike a conventional structure, the sacrificial layer is not necessary to be formed for preventing the semiconductor film from being damaged by the hydrofluoric acid cleaning or the sacrificial is not necessary subjected to etching twice.

The method of producing the array substrate 411B according to the present embodiment differs from the method of producing the array substrate 11B according to the first embodiment as follows. In a second insulation film etching process, the second drain-side contact hole 431 is formed in the second insulation film 440 so as to overlap the second drain region 424C. In a first metal film etching process, the second drain-side connection section 429 that is to be connected to the second drain region 424C through the second drain-side contact hole 431 is formed.

Before a second metal film forming process is performed, the first source region 415B and the first drain region 415C formed from the first semiconductor film 437 are respectively exposed through the first source-side contact holes 421 and the first drain-side contact holes 422 formed in the first insulation film 438, the second insulation film 440, and the third insulation film 442. Therefore, an oxide may be created on surfaces of the first source region 415B and the first drain region 415C. In such a case, a hydrofluoric acid cleaning process is preferably performed to remove the oxide. In the hydrofluoric acid cleaning process, the surfaces of the first source region 415B and the first drain region 415C are cleaned with hydrofluoric acid through the first source-side contact holes 421 and the first drain-side contact holes 422. The second source region 424B and the second drain region 424C that are formed through the second semiconductor film etching process are covered with the third insulation film 442 and therefore, they are less likely to be damaged by the hydrofluoric acid cleaning process.

Specifically, the second source region 424B that is formed in the second semiconductor film etching process is connected to the second source-side connection section 428 through the second source-side contact hole 430 that is formed in the second insulation film 440 through the second insulation film etching process previously performed. Therefore, before the second metal film 443 is formed, the second source region 424B is covered with the third insulation film 442 and not exposed. The second drain-side connection section 429 is formed in the first metal film etching process and therefore, the second drain-side contact hole 431 is formed in the second insulation film 440 through the second insulation film etching process. The second drain region 424C that is formed through the second semiconductor film etching process is connected to the second drain-side connection section 429 through the second drain-side contact hole 431. According to such a structure, the second drain region 424C is covered with the third insulation film 442 and is not exposed before the second metal film 443 is formed. Therefore, unlike a conventional structure, the sacrificial layer is not necessary to be formed for preventing the semiconductor film from being damaged by the hydrofluoric acid cleaning or the sacrificial is not necessary subjected to etching twice.

Other Embodiments

The present technology is not limited to the embodiments, which have been described using the foregoing descriptions and the drawings. For example, embodiments described below are also included in the technical scope.

(1) In each of the above embodiments, the first drain line is formed from the first metal film but may be formed from the second metal film or the lower layer-side metal film. The first drain line that is formed from the second metal film may be directly continuous to the first drain-side connection section that is formed from the second metal film without being through a contact hole. On the other hand, if the first drain line is formed from the lower layer-side metal film, the first drain-side contact holes may be formed in the lower layer-side insulation film, the first insulation film, the second insulation film, and the third insulation film such that the first drain line formed from the lower layer-side metal film is connected to the first drain-side connection section formed from the second metal film through the first drain-side contact holes.

(2) Other than each of the above embodiments, a plan-view routing path (a planar shape) or a line width of various lines such as the first gate line, the first source line, the first drain line, the second gate line, and the second source line may be altered as appropriate.

(3) In each of the above embodiments, the first electrode is branched from the first gate line or the second gate electrode is branched from the second gate line. However, the first gate line and the second gate line may not have such a branch structure but may be configured such that a part of the first gate line is the first gate electrode or a part of the second gate line is the second gate electrode.

(4) In each of the above embodiments, a part of the source line is the first source electrode and a part of the second line is the second source electrode. However, the first source line and the second source line may have a branch structure and the first source electrode may be branched from the first source line or the second source electrode may be branched from the second source line.

(5) Other than each of the above embodiments, a specific planar shape or a specific arrangement region (size) of each gate electrode, each source electrode, each source region, each drain region, and each channel region may be altered as appropriate. A specific planar shape or a specific arrangement region (size) of the pixel electrode and the common electrode may be also altered as appropriate. A specific planar shape or a specific arrangement region (size) of the first light blocking section and the second light blocking section may be also altered as appropriate.

(6) In the first embodiment, one pair of gate circuits are provided in the non-display region so as to sandwich the display region therebetween; however, only one gate circuit may be provided in the non-display region adjacent to one side of the display region. In the third embodiment, three gate circuits are dispersedly arranged in the display region and the number of the gate circuits dispersedly arranged in the display region may be other than three.

(7) In each of the above embodiments, the fifth insulation film made of organic insulation material is formed; however, the fifth insulation film made of the organic insulation material may not be included.

(8) In each of the above embodiments, the common electrode is formed from the first transparent electrode film and the pixel electrode is formed from the second transparent electrode film. However, the pixel electrode may be formed from the first transparent electrode film and the common electrode may be formed from the second transparent electrode film. In such a configuration, in the method of producing the array substrate, a fifth insulation film etching process is preferably performed. In the etching process, the fifth insulation film is etched together with the fourth insulation film such that second drain-side contact holes are formed in the insulation films. If the fifth insulation film is not included, a fourth insulation film etching process is preferably performed. In the etching process, the fourth insulation film is etched such that the second drain-side contact hole is formed in the fourth insulation film.

(9) In each of the above embodiments, the array substrate included in the liquid crystal panel that operates in an FFS mode is described. However, other liquid crystal panels are also included in the technical scope, for example, a liquid crystal panel that includes an in-plane switching (IPS) mode or a vertical alignment (VA) mode as an operation mode is also included in the technical scope. In the liquid crystal panel of the IPS mode or the VA mode, the array substrate does not necessarily include the common electrode and therefore the first transparent electrode film and the sixth insulation film may not be included. In such a configuration, in the method of producing the array substrate, a fifth insulation film etching process is preferably performed. In the etching process, the fifth insulation film is etched together with the fourth insulation film such that second drain-side contact holes are formed in the insulation films. If the fifth insulation film is not included, a fourth insulation film etching process is preferably performed. In the etching process, the fourth insulation film is etched such that the second drain-side contact hole is formed in the fourth insulation film.

(10) Other than each of the above embodiments, the specific material used for each metal film, each insulation film, each semiconductor film, each transparent electrode film may be altered as appropriate.

(11) In each of the above embodiments, a transmission type liquid crystal panel is described; however, a reflection type liquid crystal panel or a transflective type liquid crystal panel may be used.

(12) Other than each of the above embodiments, a planar shape of the liquid crystal panel and the array substrate included therein may be a laterally-elongated rectangular shape, a square shape, a circular shape, a semi-circular shape, an oval shape, an ellipse, or a trapezoidal shape.

(13) Other than each of the above embodiments, a display panel may include functional organic molecules other than the liquid crystal material between the pair of substrates.

(14) In each of the above embodiments, the liquid crystal panel and the array substrate included therein are described as the embodiments. However, other types of display panels (e.g., organic EL panels, plasma display panels (PDPs), electrophoretic display panels (EPD), and micro electro mechanical system (MEMS) display panels) or the array substrate included in such display panels are also included in the technical scope.

The invention claimed is:

1. A semiconductor device comprising:
a first semiconductor film;
a first insulation film disposed on an upper layer side of the first semiconductor film;
a first metal film disposed on an upper layer side of the first insulation film;
a second insulation film disposed on an upper layer side of the first metal film;
a second semiconductor film disposed on an upper layer side of the second insulation film;
a third insulation film disposed on an upper layer side of the second semiconductor film;
a second metal film disposed on an upper layer side of the third insulation film;
a fourth insulation film disposed on an upper layer side of the second metal film;
a transparent electrode film disposed on an upper layer side with respect to the fourth insulation film;
a first TFT including
a first gate electrode that is formed from a part of the first metal film,
a first channel region that is formed from a part of the first semiconductor film and disposed to overlap the first gate electrode,
a first source region that is formed from a part of the first semiconductor film and continuous to the first channel region, and
a first drain region that is formed from a part of the first semiconductor film and continuous from a section of the first channel region opposite from a first source region side;
a first source-side connection section that is formed from a part of the second metal film and disposed to overlap the first source region and connected to the first source region through first source-side contact holes formed in the first insulation film, the second insulation film, and the third insulation film;
a first drain-side connection section that is formed from a part of the second metal film and disposed to overlap the first drain region and connected to the first drain region through first drain-side contact holes formed in the first insulation film, the second insulation film, and the third insulation film;
a second TFT that is driven by the first TFT and including
a second gate electrode that is formed from a part of the second metal film,
a second channel region that is formed from a part of the second semiconductor film and disposed to overlap the second gate electrode,
a second source region that is formed from a part of the second semiconductor film and continuous to the second channel region, and
a second drain region that is formed from a part of the second semiconductor film and continuous from a section of the second channel region opposite from a second source region side;
a second source-side connection section that is formed from a part of the first metal film and disposed to overlap the second source region and connected to the second source region through a second source-side contact hole formed in the second insulation film; and
a second drain-side connection section that is formed from a part of the first metal film or the transparent electrode film and disposed to overlap the second drain region and connected to the second drain region through a second drain-side contact hole formed in the second insulation film or at least the fourth insulation film.

2. The semiconductor device according to claim 1, further comprising a first drain opposite-side connection section that is formed from the first metal film and connected to a section of the first drain-side connection section opposite from a first drain region side through first drain opposite-side contact holes formed in the second insulation film and the third insulation film.

3. The semiconductor device according to claim 1, wherein the first semiconductor film is a polycrystalline silicone film.

4. The semiconductor device according to claim 1, wherein the second semiconductor film is an oxide semiconductor film, and the second source region and the second drain region are sections of the second semiconductor film whose resistance is lowered.

5. A display device comprising:
the semiconductor device according to claim 1;
a display region displaying an image; and
a non-display region displaying no image.

6. The display device according to claim 5, wherein
at least the second TFT, the second source-side connection section, and the second drain-side connection section are arranged in the display region, and
the second drain-side connection section is formed from the transparent electrode film and forms a pixel electrode.

7. The display device according to claim 5, wherein at least the second TFT is arranged in the display region, the display device further comprising:
a lower layer-side insulation film disposed on a lower layer side of the first semiconductor film;
a lower layer-side metal film disposed on a lower layer side of the lower layer-side insulation film; and
a light blocking section that is formed from the lower layer-side metal film and disposed to overlap at least the second channel region.

8. The display device according to claim 7, wherein the light blocking section is a lower layer-side gate electrode that is configured to drive the second TFT.

9. The display device according to claim 5, wherein at least the first TFT is arranged in the non-display region, the display device further comprising:
a lower layer-side insulation film disposed on a lower layer side of the first semiconductor film;
a lower layer-side metal film disposed on a lower layer side of the lower layer-side insulation film; and
a light blocking section that is formed from the lower layer-side metal film and disposed to overlap at least the first channel region.

10. The display device according to claim 5, wherein at least the first TFT is arranged in the display region, the display device further comprising:
- a lower layer-side insulation film disposed on a lower layer side of the first semiconductor film;
- a lower layer-side metal film disposed on a lower layer side of the lower layer-side insulation film; and
- a light blocking section that is formed from the lower layer-side metal film and disposed to overlap at least the first channel region.

* * * * *